US012775756B2

(12) United States Patent
Phan

(10) Patent No.: US 12,775,756 B2
(45) Date of Patent: Oct. 27, 2026

(54) SYSTEMS AND METHODS FOR STRUCTURAL ANALYSIS FOR INSPECTED BLADED ROTORS

(71) Applicant: Raytheon Technologies Corporation, Farmington, CT (US)

(72) Inventor: Uyen Phan, Arcadia, CA (US)

(73) Assignee: RTX Corporation, Farmington, CT (US)

( * ) Notice: Subject to any disclaimer, the term of this patent is extended or adjusted under 35 U.S.C. 154(b) by 806 days.

(21) Appl. No.: 17/900,716

(22) Filed: Aug. 31, 2022

(65) Prior Publication Data

US 2023/0315949 A1 Oct. 5, 2023

Related U.S. Application Data

(60) Provisional application No. 63/327,748, filed on Apr. 5, 2022.

(51) Int. Cl.

*G06F 30/23* (2020.01)
*G01M 5/00* (2006.01)
*G06F 30/17* (2020.01)

(52) U.S. Cl.

CPC ........... *G06F 30/23* (2020.01); *G01M 5/0033* (2013.01); *G06F 30/17* (2020.01)

(58) Field of Classification Search

CPC ...... G06F 30/23; G06F 30/17; G01M 5/0033; G01M 15/14; F01D 5/005; F01D 21/003; F05D 2260/80; F05D 2230/80

See application file for complete search history.

(56) References Cited

U.S. PATENT DOCUMENTS 4,811,253 A 3/1989 Johns
4,858,146 A 8/1989 Shebini
(Continued)

FOREIGN PATENT DOCUMENTS

CA 3173329 7/2021
CN 110362957 10/2019
(Continued)

OTHER PUBLICATIONS

European Patent Office, European Office Action dated Aug. 21, 2025 in Application No. 23166874.0.
(Continued)

*Primary Examiner* — Courtney D Heinle
*Assistant Examiner* — Andrew Thanh Bui
(74) *Attorney, Agent, or Firm* — SNELL & WILMER L.L.P.

(57) ABSTRACT

A method can comprise: performing a finite element static analysis of an inspected blade of an inspected bladed rotor, the inspected blade having a repair blend profile modeled thereon, the repair blend profile exceeding a threshold repair size; performing a finite element modal analysis of the inspected blade having the repair blend profile; performing a fatigue assessment based on results from the finite element static analysis and the finite element modal analysis, the fatigue assessment including limits based on material properties of the inspected blade, the material properties based on test results at a threshold significance level; and repairing the inspected bladed rotor with the repair blend profile in response to the fatigue assessment meeting a deterministic criteria.

20 Claims, 13 Drawing Sheets

(56) References Cited

U.S. PATENT DOCUMENTS

| | | | | |
|---|---|---|---|---|
| 4,955,269 | A | 9/1990 | Kendig et al. | |
| 5,253,978 | A | 10/1993 | Fraser | |
| 5,993,161 | A | 11/1999 | Shapiro et al. | |
| 6,814,543 | B2 | 11/2004 | Barb et al. | |
| 6,915,236 | B2 | 7/2005 | Tanner et al. | |
| 7,068,301 | B2 | 6/2006 | Thompson | |
| 7,082,371 | B2 | 7/2006 | Griffin et al. | |
| 7,206,709 | B2 | 4/2007 | Griffin et al. | |
| 7,810,385 | B1 | 10/2010 | Narcus | |
| 8,024,137 | B2 * | 9/2011 | Kuehhorn | G01H 9/00 702/56 |
| 8,045,144 | B2 | 10/2011 | Manfred | |
| 8,255,170 | B2 | 8/2012 | Kollgaard et al. | |
| 8,881,392 | B2 | 11/2014 | Derrien et al. | |
| 9,036,892 | B2 | 5/2015 | Domke et al. | |
| 9,477,224 | B2 | 10/2016 | Khan et al. | |
| 9,483,605 | B2 * | 11/2016 | Morris | G06F 30/17 |
| 9,739,167 | B2 | 8/2017 | Heinig et al. | |
| 9,984,474 | B2 | 5/2018 | Bendall et al. | |
| 10,013,752 | B2 | 7/2018 | Salm et al. | |
| 10,156,140 | B2 | 12/2018 | Walker et al. | |
| 10,174,623 | B2 | 1/2019 | Scott | |
| 10,191,478 | B2 | 1/2019 | Georgeson et al. | |
| 10,360,326 | B2 * | 7/2019 | Lamicq | F01D 5/10 |
| 10,378,455 | B2 | 8/2019 | Bengea et al. | |
| 10,379,020 | B2 | 8/2019 | Sever et al. | |
| 10,633,976 | B2 | 4/2020 | Nissen et al. | |
| 10,762,255 | B2 | 9/2020 | Feiner et al. | |
| 10,955,815 | B2 | 3/2021 | Auxier et al. | |
| 11,268,881 | B2 | 3/2022 | Finn et al. | |
| 11,407,035 | B2 | 8/2022 | Shi et al. | |
| 11,434,764 | B2 | 9/2022 | Morris et al. | |
| 11,447,271 | B2 | 9/2022 | Somanath et al. | |
| 11,703,322 | B2 | 7/2023 | Yin et al. | |
| 11,840,032 | B2 | 12/2023 | Rahman et al. | |
| 11,865,655 | B2 | 1/2024 | Griffin et al. | |
| 12,115,598 | B2 | 10/2024 | Tracy et al. | |
| 2004/0148129 | A1 | 7/2004 | Gotoh et al. | |
| 2004/0225474 | A1 | 11/2004 | Goldfine et al. | |
| 2004/0243310 | A1 | 12/2004 | Griffin et al. | |
| 2005/0033555 | A1 | 2/2005 | Tanner et al. | |
| 2006/0073022 | A1 | 4/2006 | Gentile et al. | |
| 2007/0005527 | A1 | 1/2007 | Parthasarathy | |
| 2008/0250659 | A1 | 10/2008 | Bellerose et al. | |
| 2009/0089020 | A1 | 4/2009 | Boyer et al. | |
| 2010/0064515 | A1 | 3/2010 | Eichmann et al. | |
| 2010/0153080 | A1 | 6/2010 | Khan et al. | |
| 2011/0166798 | A1 | 7/2011 | Knodel et al. | |
| 2013/0158832 | A1 | 6/2013 | Moeckly | |
| 2013/0170947 | A1 | 7/2013 | Kurt-Elli et al. | |
| 2014/0030092 | A1 | 1/2014 | Heining et al. | |
| 2014/0100703 | A1 | 4/2014 | Siegmund et al. | |
| 2014/0114587 | A1 | 4/2014 | Czerniak et al. | |
| 2015/0160164 | A1 | 6/2015 | Plotnikov et al. | |
| 2016/0246287 | A1 | 8/2016 | Modgil | |
| 2017/0176342 | A1 | 6/2017 | Colletti | |
| 2017/0370220 | A1 | 12/2017 | Morris et al. | |
| 2018/0341836 | A1 | 11/2018 | Lim et al. | |
| 2019/0338666 | A1 | 11/2019 | Finn et al. | |
| 2019/0339165 | A1 | 11/2019 | Finn et al. | |
| 2020/0004225 | A1 | 1/2020 | Buller | |
| 2020/0102827 | A1 | 4/2020 | Morris et al. | |
| 2020/0159879 | A1 | 5/2020 | Feiner et al. | |
| 2020/0182604 | A1 | 6/2020 | Kocic | |
| 2022/0001500 | A1 | 1/2022 | Rahman et al. | |
| 2022/0099067 | A1 | 3/2022 | Packer | |
| 2022/0100919 | A1 | 3/2022 | Chakrabarti et al. | |
| 2022/0161326 | A1 | 5/2022 | Nelson et al. | |
| 2022/0266399 | A1 | 8/2022 | Griffin | |
| 2023/0304878 | A1 | 9/2023 | Drodofsky et al. | |

FOREIGN PATENT DOCUMENTS

| | | |
|---|---|---|
| EP | 2655005 | 10/2014 |
| EP | 2889601 | 7/2015 |
| EP | 3220119 | 9/2017 |
| EP | 2507009 | 11/2017 |
| EP | 3705726 | 9/2020 |
| EP | 3979120 | 4/2022 |
| WO | 2012001852 | 1/2012 |
| WO | 20170192998 | 11/2017 |
| WO | 2020053778 | 3/2020 |
| WO | 2021150579 | 7/2021 |

OTHER PUBLICATIONS

European Patent Office, European Office Action dated Aug. 21, 2025 in Application No. 23166868.2.
USPTO; Non-Final Office Action dated Jul. 29, 2025 in U.S. Appl. No. 17/730,104.
USPTO; Non-Final Office Action dated Jul. 29, 2025 in U.S. Appl. No. 17/862,194.
USPTO; Non-Final Office Action dated Aug. 13, 2025 in U.S. Appl. No. 17/862,207.
USPTO; Non-Final Office Action dated Mar. 26, 2025 in U.S. Appl. No. 17/730,131.
USPTO; Final Office Action dated Apr. 3, 2025 in U.S. Appl. No. 17/862,194.
European Patent Office, European Search Report dated Aug. 22, 2023 in Application No. 23166856.7.
European Patent Office, European Search Report dated Aug. 29, 2023 in Application No. 23166872.4.
European Patent Office, European Search Report dated Aug. 22, 2023 in Application No. 23166863.3.
European Patent Office, European Search Report dated Aug. 29, 2023 in Application No. 23166864.1.
USPTO; Corrected Notice of Allowance dated Oct. 16, 2023 in U.S. Appl. No. 17/730,120.
European Patent Office, European Search Report dated Aug. 29, 2023 in Application No. 23164478.2.
Bai Bin et al: "Application of multi-stage multi-objective multi-disciplinary agent model based on dynamic substructural method in Mistuned Blisk", Aerospace Science and Technology, Elsevier Masson, FR, vol. 46, Jul. 8, 2015, pp. 104-115, DOI: 10.1016/J.AST.2015.06.030.
D'Souza Kiran et al: "Analyzing mistuned multi-stage turbomachinery rotors with aerodynamic effects", Journal of Fluids and Structures, Academic Press, Amsterdam, NL, vol. 42, Aug. 17, 2013, pp. 388-400, DOI: 10.1016/J.JFLUIDSTRUCTS.2013.07.007.
Nyssen Fet al: "Experimental modal identification of mistuning in an academic two-stage drum", Mechanical Systems and Signal Processing, vol. 88, Nov. 14, 2016 (Nov. 14, 2016), pp. 428-444, DOI: 10.1016/J.YMSSP.2016.10.030.
European Patent Office, European Search Report dated Oct. 19, 2023 in Application No. 23176124.8.
USPTO; Non-Final Office Action dated Nov. 22, 2023 in U.S. Appl. No. 17/845,656.
USPTO; Corrected Notice of Allowance dated Nov. 9, 2023 in U.S. Appl. No. 17/730,120.
European Patent Office, European Search Report dated Nov. 14, 2023 in Application No. 23164760.3.
USPTO; Notice of Allowance dated Feb. 28, 2025 in U.S. Appl. No. 17/730,086.
USPTO; Notice of Allowance dated Apr. 17, 2024 in U.S. Appl. No. 17/845,656.
European Patent Office, European Partial Search Report dated Aug. 14, 2023 in Application No. 23164760.3.
European Patent Office, European Search Report dated Aug. 14, 2023 in Application No. 23164481.6.
European Patent Office, European Search Report dated Aug. 10, 2023 in Application No. 23164480.8.
European Patent Office, European Search Report dated Aug. 10, 2023 in Application No. 23164474.1.

(56) References Cited

OTHER PUBLICATIONS

European Patent Office, European Search Report dated Aug. 22, 2023 in Application No. 23166849.2.
European Patent Office, European Search Report dated Aug. 29, 2023 in Application No. 23166874.0.
Khemiri, et al: "Asymtotic description of damping mistuning effects on the forced response of turbomachinery bladed disk", Journal of Sound and Vibration, vol. 332, No. 20, pp. 4998-5013, Dated May 20, 2013.
Ganine, et al: "A sparse preconditioned iterative method for vibration analysis of geometrically mistuned bladed disk", Computers and Structures, Pergamon Press, GB vol. 87, No. 5-6, pp. 342-354, dated Mar. 1, 2009.
Rodriguez, et al: "Analysis of expirimental results of turbomachinery fluttes using an asymptotic reduced order model", Journal of Sound and Vibration, Elsevier, Amsterdam, NL, vol. 509, 15 pages dated May 25, 2021.
Beck, et al. "Probabilistic Study of Intergrally Bladed Rotor Blends using Geometric Mistuning Models" 58th AIAA/ASCE/AHS/ASC Structures, Structural Dynamics, and Materials Confrence, 12 pages dated Jan. 5, 2017.
European Patent Office, European Search Report dated Aug. 29, 2023 in Application No. 23166868.2.
European Patent Office, European Search Report dated Aug. 14, 2023 in Application No. 23164852.8.
USPTO; Non-Final Office Action dated May 4, 2023 in U.S. Appl. No. 17/730,120.
USPTO; Notice of Allowance dated Sep. 1, 2023 in U.S. Appl. No. 17/730,120.
European Patent Office, European Search Report dated Nov. 4, 2024 in Application No. 24169808.3.
USPTO; Notice of Allowance dated Feb. 6, 2025 in U.S. Appl. No. 17/730,086.
USPTO; Requirement for Restriction/ Election dated Jan. 27, 2025 in U.S. Appl. No. 17/730,131.
USPTO; Non-Final Office Action dated Dec. 16, 2024 in U.S. Appl. No. 17/862,194.
USPTO; Non-Final Office Action dated Nov. 22, 2024 in U.S. Appl. No. 18/114,890.
USPTO; Non-Final Office Action dated Oct. 15, 2024 in U.S. Appl. No. 17/730,086.
USPTO; Requirement for Restriction dated Jun. 21, 2024 in U.S. Appl. No. 17/730,086.
USPTO; Notice of Allowance dated May 20, 2025 in U.S. Appl. No. 18/114,890.
European Patent Office, European Office Action dated Apr. 4, 2025 in Application No. 23164760.3.
European Patent Office, European Office Action dated Mar. 24, 2025 in Application No. 23164481.6.
European Patent Office, European Office Action dated Mar. 24, 2025 in Application No. 23164480.8.
European Patent Office, European Office Action dated Mar. 19, 2025 in Application No. 23164474.1.
European Patent Office, European Office Action dated Apr. 10, 2025 in Application No. 23166856.7.
European Patent Office, European Office Action dated Mar. 24, 2025 in Application No. 23166863.3.
European Patent Office, European Office Action dated Mar. 24, 2025 in Application No. 23166849.2.
European Patent Office, European Office Action dated Mar. 24, 2025 in Application No. 23164852.8.
USPTO; Advisory Action dated May 30, 2025 in U.S. Appl. No. 17/862,194.
USPTO; Non-Final Office Action dated Feb. 17, 2026 in U.S. Appl. No. 17/862,168.
USPTO; Final Office Action dated Feb. 5, 2026 in U.S. Appl. No. 17/862,207.
USPTO; Notice of Allowance dated Dec. 8, 2025 in U.S. Appl. No. 17/730,131.
USPTO; Non-Final Office Action dated Nov. 24, 2025 in U.S. Appl. No. 17/730,128.
USPTO; Non-Final Office Action dated Oct. 23, 2025 in U.S. Appl. No. 17/885,868.
USPTO; Notice of Allowance dated Oct. 31, 2025 in U.S. Appl. No. 17/730,131.
USPTO; Final Office Action dated Nov. 14, 2025 in U.S. Appl. No. 17/862,194.
USPTO; Notice of Allowance dated Mar. 18, 2026 in U.S. Appl. No. 17/730,104.
USPTO; Final Office Action dated Mar. 19, 2026 in U.S. Appl. No. 17/730,128.
USPTO; Non-Final Office Action dated Mar. 4, 2026 in U.S. Appl. No. 17/963,898.
European Patent Office, European Office Action dated Feb. 9, 2026 in Application No. 24169808.3.
USPTO; Notice of Allowance dated Sep. 16, 2025 in U.S. Appl. No. 17/730,131.
USPTO; Notice of Allowance dated Sep. 24, 2025 in U.S. Appl. No. 17/730,131.
European Patent Office, European Office Action dated Aug. 21, 2025 in Application No. 23164478.2.
European Patent Office, European Office Action dated Aug. 21, 2025 in Application No. 23166864.1.
USPTO; Notice of Allowance dated Mar. 5, 2026 in U.S. Appl. No. 17/730,104.
USPTO; Notice of Allowance dated Apr. 6, 2026 in U.S. Appl. No. 17/862,194.
USPTO; Advisory Action dated Jan. 27, 2026 in U.S. Appl. No. 17/862,194.
USPTO; Advisory Action dated Apr. 23, 2026 in U.S. Appl. No. 17/862,207.
USPTO; Notice of Allowance dated Apr. 24, 2026 in U.S. Appl. No. 17/862,194.
USPTO; Notice of Allowance dated May 11, 2026 in U.S. Appl. No. 17/862,194.
USPTO; Notice of Allowance dated May 18, 2026 in U.S. Appl. No. 17/862,194.
European Patent Office, European Office Action dated May 4, 2026 in Application No. 23166863.3.
USPTO; Notice of Allowance dated May 27, 2026 in U.S. Appl. No. 17/730,104.
USPTO; Advisory Action dated May 27, 2026 in U.S. Appl. No. 17/730,128.
USPTO; Notice of Allowance dated Jun. 24, 2026 in U.S. Appl. No. 17/730,128.
USPTO; Notice of Allowance dated Jun. 17, 2026 in U.S. Appl. No. 17/862,194.
USPTO; Non-Final Office Action dated Jun. 29, 2026 in U.S. Appl. No. 17/862,207.
USPTO; Notice of Allowance dated Jul. 15, 2026 in U.S. Appl. No. 17/963,898.
USPTO; Notice of Allowance dated Jul. 30, 2026 in U.S. Appl. No. 17/900,716.
European Patent Office, European Office Action dated Jul. 20, 2026 in Application No. 23164474.1.

* cited by examiner

SECT A-A

SECT B-B

SYSTEMS AND METHODS FOR STRUCTURAL ANALYSIS FOR INSPECTED BLADED ROTORS

CROSS-REFERENCE TO RELATED APPLICATIONS

This application is a non-provisional of, and claims priority to, and the benefit of U.S. Provisional Application No. 63/327,748, entitled "BLADED ROTOR INSPECTION, ANALYSIS AND REPAIR SYSTEMS AND METHODS," filed on Apr. 5, 2022, which is hereby incorporated by reference in its entirety for all purposes.

FIELD

The present disclosure relates to repair analysis methods and systems, and more particularly, the repair analysis systems and methods for bladed rotors of gas turbine engines utilizing a structural assessment for large repair blend profiles.

BACKGROUND

Gas turbine engines (such as those used in electrical power generation or used in modern aircraft) typically include a compressor, a combustor section, and a turbine. The compressor and the turbine typically include a series of alternating rotors and stators. A rotor generally comprises a rotor disk and a plurality of blades. The rotor may be an integrally bladed rotor ("IBR") or a mechanically bladed rotor.

The rotor disk and blades in the IBR are one piece (i.e., monolithic, or nearly monolithic) with the blades spaced around the circumference of the rotor disk. Conventional IBRs may be formed using a variety of technical methods including integral casting, machining from a solid billet, or by welding or bonding the blades to the rotor disk.

Repair methods for IBRs may be limited to maintaining the IBR within tolerances of a product definition for a design of the IBR, a volume or thickness of material addition, and/or a volume or thickness of material removal. Additionally, repair analysis methods for IBRs may fail to consider loads and/or boundary conditions encountered during engine operation included in the aerodynamic, structural, or other functional assessment of the IBR. In this regard, a damaged IBR may be scrapped because it is believed to unrepairable within the geometric assessment constraints (e.g., tolerances, material removal, material addition, etc.) without consideration of the functional assessment constraints (e.g., aerodynamic stability, structural durability, etc.). By being limited in this manner, less expensive repair options and/or more optimal repairs (e.g., in terms of aerodynamic or structural capability, etc.) that could otherwise be acceptable may be avoided.

SUMMARY

A method is disclosed herein. In various embodiments, the method comprises: performing a finite element static analysis of an inspected blade of an inspected bladed rotor, the inspected blade having a repair blend profile modeled thereon, the repair blend profile exceeding a threshold repair size; performing a finite element modal analysis of the inspected blade having the repair blend profile; performing a fatigue assessment based on results from the finite element static analysis and the finite element modal analysis, the fatigue assessment including limits based on material properties of the inspected blade, the material properties based on test results at a threshold significance level; and repairing the inspected bladed rotor with the repair blend profile in response to the fatigue assessment meeting a deterministic criteria.

In various embodiments, the finite element modal analysis includes at least one of a dynamic analysis and a mistuning analysis.

In various embodiments, the method further comprises scaling stress results from the finite element modal analysis based on engine test data.

In various embodiments, performing the fatigue assessment further comprises plotting an alternating stress as a function of a mean stress on a modified Goodman diagram, the alternating stress determined from the finite element modal analysis, the mean stress determined from the finite element static analysis.

In various embodiments, the method further comprises: initiating the repair blend profile prior to the performing the finite element static analysis and the performing the finite element modal analysis; and determining the repair blend profile exceeds the threshold repair size, the threshold repair size based on prior repair blend sizes.

In various embodiments, the threshold repair size is based on at least one of a longitudinal length, a width, and a depth of a maximum experience-based repair blend profile.

In various embodiments, the method further comprises: scanning the inspected bladed rotor; and determining the repair blend profile based on data from the scanning. The method can further comprise: performing a simulation on a digital model prior to performing the finite element modal analysis and the finite element static analysis; and comparing a result from the simulation to an experience-based criteria.

In various embodiments, the method further comprises determining the experience-based criteria is not met.

A method is disclosed herein. In various embodiments, the method comprises: receiving, via a processor, a digital representation of an inspected blade from an inspection system and boundary conditions for a static analysis from a load data database, the digital representation including a repair blend profile; generating, via the processor, a finite element structural model based on the digital representation of the inspected blade and the boundary conditions; simulating, via the processor, a modal analysis of the finite element structural model; simulating, via the processor, the static analysis of the finite element structural model; and conducting, via the processor, a fatigue assessment of the inspected blade with the repair blend profile based on a material data from a material data database and results from the modal analysis of the finite element structural model and the static analysis of the finite element structural model.

In various embodiments, the material data includes a yield stress, an endurance limit, and an ultimate tensile stress of a material, the inspected blade comprising the material. In various embodiments, the yield stress, the endurance limit, and the ultimate tensile stress are a function of temperature. In various embodiments, the yield stress is based on number of flight cycles that remain for an inspected bladed rotor with the inspected blade after a repair.

In various embodiments, the method further comprises determining, via the processor and prior to generating the finite element structural model, that the repair blend profile exceeds a threshold repair blend size, the threshold repair blend size based on an experience-based criteria.

A system is disclosed herein. In various embodiments, the system comprises: an analysis system in electronic communication with an inspection system, the analysis system comprising a tangible, non-transitory computer-readable storage medium having instructions stored thereon that, in response to execution by a processor, cause the processor to perform operations comprising: receive, via the processor, a data set based on a point cloud generated from the inspection system; generate, via the processor, a finite element structural model of an inspected blade with a repair blend profile based on the data set; determine, via the processor, the repair blend profile exceeds a size of a threshold repair blend profile; simulate, via the processor, a modal analysis of the finite element structural model; simulate, via the processor, a static analysis of the finite element structural model; and conduct, via the processor, a fatigue assessment of the inspected blade with the repair blend profile.

In various embodiments, the operations further comprise determining whether results of the modal analysis and the static analysis meet a deterministic-criteria for the inspected blade based on the fatigue assessment.

In various embodiments, the system further comprises the inspection system, wherein the inspection system comprises a structured scanner.

In various embodiments, the fatigue assessment is based on a material data from a material data database and results from the modal analysis of the finite element structural model and the static analysis of the finite element structural model. In various embodiments, the material data includes a yield stress, an endurance limit, and an ultimate tensile stress of a material, the inspected blade comprising the material.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein refers to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an", or "the" may include one or more than one and that reference to an item in the singular may also include the item in the plural. Further, all ranges may include upper and lower values and all ranges and ratio limits disclosed herein may be combined.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

Figure 1A:
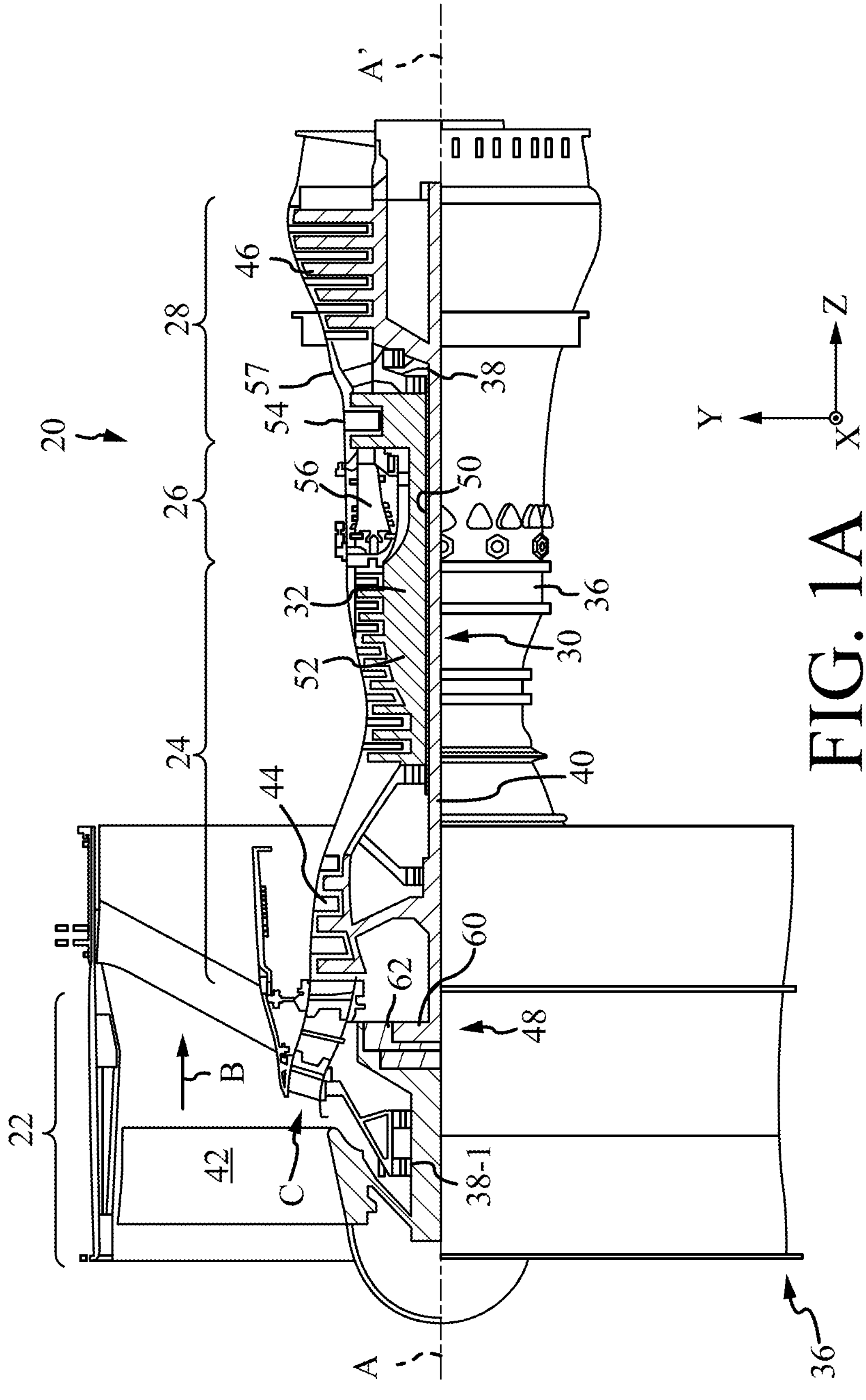
FIG. 1A illustrates a cross-sectional view of a gas-turbine engine, in accordance with various embodiments.

With reference to FIG. 1A, a gas turbine engine 20 is shown according to various embodiments. Gas turbine engine 20 may be a two-spool turbofan that generally incorporates a fan section 22, a compressor section 24, a combustor section 26, and a turbine section 28. In operation, fan section 22 can drive air along a path of bypass airflow B while compressor section 24 can drive air along a core flow path C for compression and communication into combustor section 26 then expansion through turbine section 28. Although depicted as a turbofan gas turbine engine 20 herein, it should be understood that the concepts described herein are not limited to use with turbofans as the teachings may be applied to other types of turbine engines including three-spool architectures, single spool architecture or the like.

Gas turbine engine 20 may generally comprise a low speed spool 30 and a high speed spool 32 mounted for rotation about an engine central longitudinal axis A-A' relative to an engine static structure 36 or engine case via several bearing systems 38, 38-1, etc. Engine central longitudinal axis A-A' is oriented in the Z direction on the provided X-Y-Z axes. It should be understood that various bearing systems 38 at various locations may alternatively or additionally be provided, including for example, bearing system 38, bearing system 38-1, etc.

Low speed spool 30 may generally comprise an inner shaft 40 that interconnects a fan 42, a low pressure compressor 44 and a low pressure turbine 46. Inner shaft 40 may be connected to fan 42 through a geared architecture 48 that can drive fan 42 at a lower speed than low speed spool 30. Geared architecture 48 may comprise a gear assembly 60 enclosed within a gear housing 62. Gear assembly 60 couples' inner shaft 40 to a rotating fan structure. High speed spool 32 may comprise an outer shaft 50 that interconnects a high pressure compressor 52 and high pressure turbine 54. A combustor 56 may be located between high pressure compressor 52 and high pressure turbine 54. A mid-turbine frame 57 of engine static structure 36 may be located generally between high pressure turbine 54 and low pressure turbine 46. Mid-turbine frame 57 may support one or more bearing systems 38 in turbine section 28. Inner shaft 40 and outer shaft 50 may be concentric and rotate via bearing systems 38 about the engine central longitudinal axis A-A', which is collinear with their longitudinal axes. As used herein, a "high pressure" compressor or turbine experiences a higher pressure than a corresponding "low pressure" compressor or turbine.

The core airflow may be compressed by low pressure compressor 44 then high pressure compressor 52, mixed and burned with fuel in combustor 56, then expanded over high pressure turbine 54 and low pressure turbine 46. Turbines 46, 54 rotationally drive the respective low speed spool 30 and high speed spool 32 in response to the expansion.

Figure 1B:
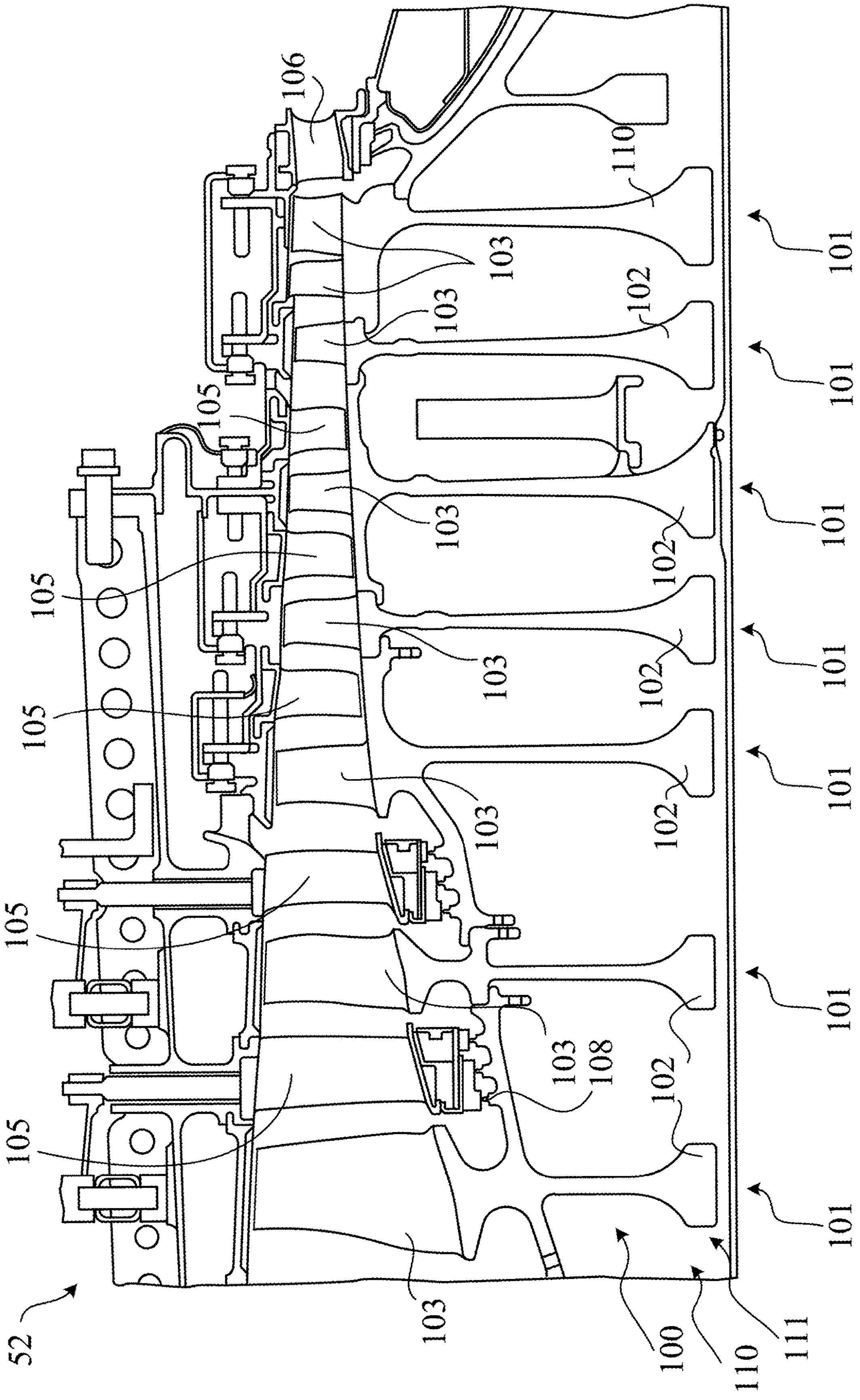
FIG. 1B illustrates a cross-sectional view of a high pressure compressor, in accordance with various embodiments.

In various embodiments, and with reference to FIG. 1B, high pressure compressor 52 of the compressor section 24 of gas turbine engine 20 is provided. The high pressure compressor 52 includes a plurality of blade stages 101 (i.e., rotor stages) and a plurality of vane stages 105 (i.e., stator stages). The blade stages 101 may each include an integrally bladed rotor ("IBR") 100, such that the blades 103 and rotor disks 102 are formed from a single integral component (i.e., a monolithic component formed of a single piece). Although described herein with respect to an IBR 100, the present disclosure is not limited in this regard. For example, the inspection, analysis, and repair systems disclosed herein can be utilized with bladed rotors formed of separate blades 103 and rotor disks 102 and still be within the scope of this disclosure.

The blades 103 extend radially outward from the rotor disk 102. The gas turbine engine 20 may further include an exit guide vane stage 106 that defines the aft end of the high pressure compressor 52. Although illustrated with respect to high pressure compressor 52, the present disclosure is not limited in this regard. For example, the low pressure compressor 44 may include a plurality of blade stages 101 and vane stages 105, each blade stage in the plurality of blade stages 101 including the IBR 100 and still be within the scope of this disclosure. In various embodiments, the plurality of blade stages 101 form a stack of IBRs 110, which define, at least partially, a rotor module 111 of the high pressure compressor 52 of the gas turbine engine 20.

Figure 2:
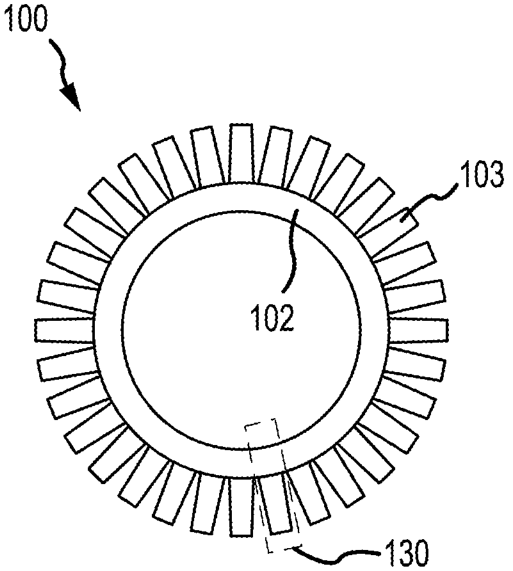
FIG. 2 illustrates a front view of a bladed rotor, in accordance with various embodiments.

Referring now to FIG. 2, a front view of an IBR 100 is illustrated, in accordance with various embodiments. The IBR 100 includes a rotor disk 102 and a plurality of blades 103 extending radially outward from the rotor disk 102.

When debris is ingested into the gas turbine engine 20, the debris can pass into the primary flowpath. Due to the rotation of the blades 103 in the primary flowpath, the debris can contact one or more of the blades 103. This contact can cause damage or wear to a blade 103, or a set of the blades 103. Disclosed herein are systems and methods for inspection, analysis, and repair of an IBR 100 and for returning an IBR 100 back to service after inspection (or after repair). The systems and methods disclosed herein facilitate faster dispositions the more the process is utilized. In this regard, the systems and methods disclosed herein provide a feedback system for continuous improvement of the repair process, in accordance with various embodiments.

Figure 3:
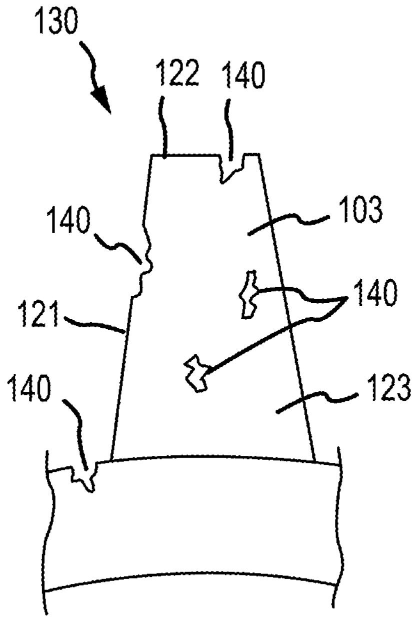
FIG. 3 illustrates a portion of an inspected bladed rotor, in accordance with various embodiments.

With combined reference to FIGS. 2 and 3, a damaged portion 130 from FIG. 2 of an IBR 100 including a substantial number of defects 140 (e.g., damage, wear, etc.) resulting from use of the IBR 100 in the gas turbine engine 20 from FIG. 1A over time is illustrated, in accordance with various embodiments. The size and shape of the defects 140 illustrated in FIG. 3 are exaggerated for illustrative effect. Further, the defects 140 can extend to all of the blades 103 of the IBR 100, the rotor disk 102, a set of the blades 103 of the IBR 100, a single blade in the blades 103, none of the blades 103, or the like.

In order to repair the defect 140, a blending operation can be performed on the IBR 100. A blending operation uses a material removal process, such as milling or computer numerical control (CNC) machining, to remove the damaged portion of the IBR 100 and smooth the resulting voids such that the IBR 100 can be re-introduced into service for further use (i.e., meeting structural and/or aerodynamic criteria for further use in service).

Figure 4:
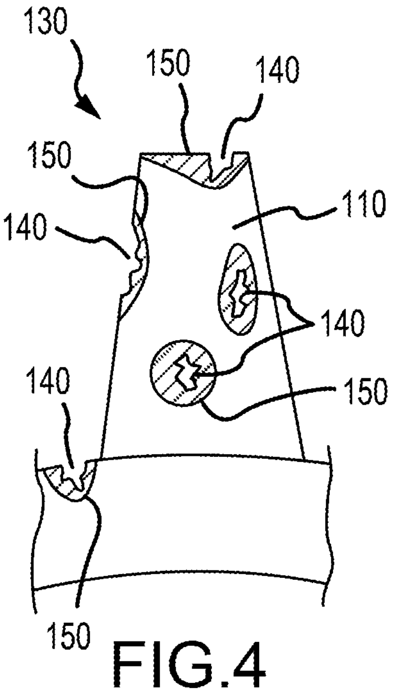
FIG. 4 illustrates a portion of the inspected bladed rotor during repair, in accordance with various embodiments.

Referring now to FIG. 4, the damaged portion 130 with an additional blending mask 150 applied to each of the locations of the defects 140 is illustrated, in accordance with various embodiments. As with the locations of the defects 140, the blending masks 150 are highly exaggerated in scale for explanatory effect. The blending masks 150 can be physical masking applied to the IBR 100, or shaded colors on computer simulations of the IBR 100. In either case, the blending masks 150 indicate what portions of the material of the blade 103 and/or the rotor disk 102 should be removed in order for the IBR 100 to be suitable for utilization in the gas turbine engine 20 after blending. The blending mask 150 ensures that accurate and consistent blends are made in operations that require or utilize manual removal of material. Although illustrated as having blending mask 150, the present disclosure is not limited in this regard. For example, repair process can be performed, as described further herein, using automated processes, such as computer numerical control (CNC) machining or the like without the use of a blending mask 150 and still be within the scope of this disclosure.

Figure 5A:
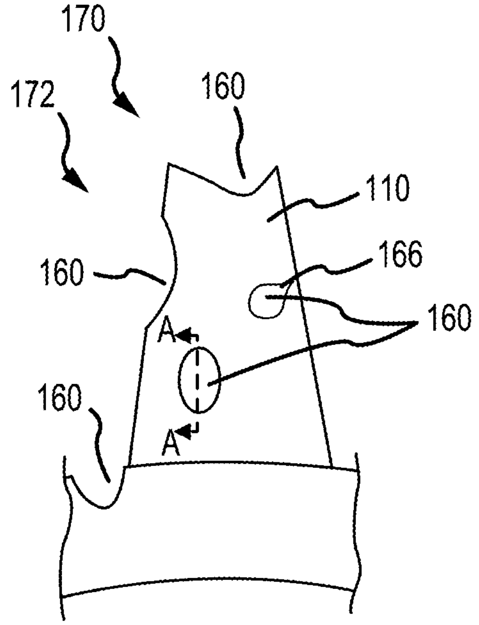
FIG. 5A illustrates a portion of a repaired bladed rotor, in accordance with various embodiments.

Once the blending mask 150 has been applied, material is removed using the generally manual material removal operation resulting in a repaired blade portion 172 of a repaired IBR 170 including a plurality of repair blend profiles 160, as is illustrated in FIG. 5A.

In various embodiments, each repair blend profile in the plurality of repair blend profiles 160 is based, at least partially, on a defect shape of a respective defect 140 from FIG. 3. In various embodiments, as described further herein, the systems and methods disclosed herein facilitate a greater number of potential blend options for a respective defect 140 from FIG. 3. For example, if a repair blend was too large and fell out of experience based functional criteria, an IBR 100 could be scrapped as opposed to being blended as described further herein and placed back into service.

In various embodiments, explicit instructions are derived from the automated process and supplied to a computer numerical controlled (CNC) machine. In this instance, blending masks may not be utilized as the manual blending operation is replaced by the machine automated process. Blends of IBR 100 can be by either manual or automated processes, or a combination of those processes. In wholly automated processes, the creation of the mask can be omitted.

In addition to removing the locations of the defects 140, it is beneficial to remove material deeper than the observed damage in order to ensure that all damage is removed and to prevent the propagation of new damage. In various embodiments, a blend aspect ratio (e.g., a length-depth ratio) is maintained in order to ensure that there is a smooth and gradual transition from the edge of the undamaged blade 103 to the bottom of the deepest portion of the blend, and then back to the undamaged surface of the blade 103 on the other side of the blend.

Although FIGS. 2-5A illustrated blending solutions applied to the IBR 100 in locations including the rotor disk 102, the blade 103, an edge 121 (e.g., a leading edge or a trailing edge), a tip 122, an airfoil surface 123 (e.g., a pressure surface or a suction surface), it can be appreciated that a repair of each location shown on the same blade 103 is unlikely. The various locations are shown for illustrative purposes of potential repair locations, in accordance with various embodiments. The illustrated defects 140, blending masks 150, and repair blend profiles 160 on the IBR 100 are exemplary of the limited applications and not of every repair made according to the description herein.

In order to assist with the blending process and, facilitate efficient determination of acceptability of an IBR 100 to return into service, a semi-automated (or fully automated) system is utilized to inspect, analyze, and repair an IBR 100, in accordance with various embodiments.

In various embodiments, repair blend profiles 160 can include a scallop shape (e.g., repair blend shape 162 from FIG. 5B), a tear drop shape (e.g., repair blend shape 166 from FIG. 5A), a material reduction along an edge (i.e., chord reduction) (e.g., repair blend shape 168 from FIG. 5D), or the like. The present disclosure is not limited in this regard.

Figure 5B:
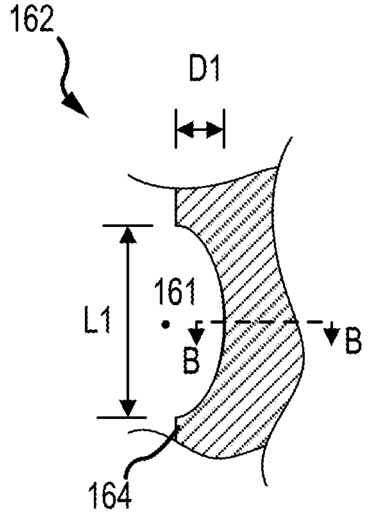
FIG. 5B illustrates a repair blend profile, in accordance with various embodiments.
Figure 5C:
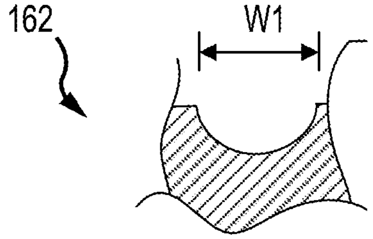
FIG. 5C illustrates a repair blend profile, in accordance with various embodiments.

For example, with reference now to FIGS. 5B, and 5C, a repair blend profile 162 is illustrated. In various embodiments, the repair blend profile comprises a convex shape and defines a recess in an outer surface of the repaired IBR 170 (e.g., a pressure surface, a suction surface, a rotor disk surface, or the like). In various embodiments, the repair blend profile is recessed from the outer surface 164 of the repaired IBR 170. In various embodiments, the repair blend profile 162 comprises a depth D1, a length L1 and a width W1. In various embodiments, the repair blend has a length L1 that is greater than a width W1. However, the present disclosure is not limited in this regard. For example, the length L1 can be equal to the width W1, in accordance with various embodiments. An aspect ratio of a blend profile, as referred to herein, refers to a length L1 dived by a width W1 of the repair blend profile. In various embodiments, the repair blend profile is substantially symmetric about a plane defined by a first point, a second point and a third point. The first point can be a max depth location. The second point and the third point can define a line that measures a maximum length (e.g., length L1) of the repair blend, in various embodiments. In various embodiments, the second point and the third point can define a line that measures a width in a perpendicular direction from the length L1. The present disclosure is not limited in this regard. As referred to herein, "substantially symmetrical" is a first profile on a first side of the plane that is within a profile of between 0.01 inches (0.025 cm) and 0.25 inches (0.64 cm) from the second profile on the second side of the plane, or between 0.01 inches (0.025 cm) and 0.125 inches (0.32 cm), or between 0.01 inches (0.25 cm) and 0.0625 inches (0.16 cm).

Figure 5D:
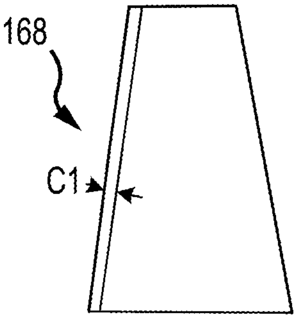
FIG. 5D illustrates a repair blend profile, in accordance with various embodiments.

Although described herein as being substantially symmetrical, the present disclosure is not limited in this regard. For example, the repair blend profile can comprise a tear drop shape (e.g., repair blend profile 166 from FIG. 5B), a chord reduction (i.e., shorting a chord length by a chord reduction length C1 along a span of the blade 103 of the repaired IBR 168 as shown in FIG. 5D), or the like. The present disclosure is not limited in this regard.

Figure 6A:
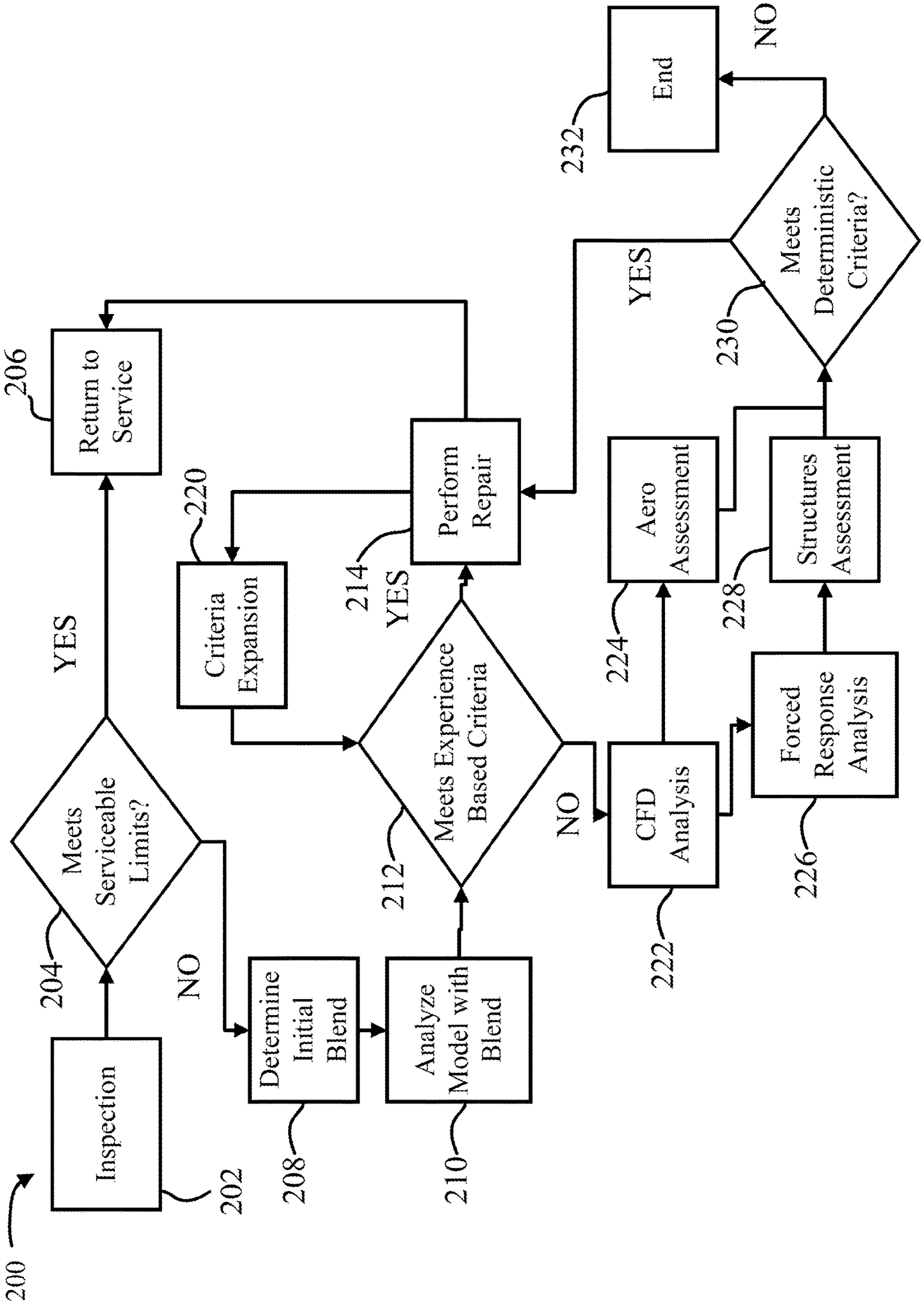
FIG. 6A illustrates an inspection, analysis, and repair process for a bladed rotor, in accordance with various embodiments.

Referring now to FIG. 6A, a process 200 for repairing an IBR 100 from FIG. 1B from a compressor section (e.g., compressor section 24) of a gas turbine engine 20 from FIG. 1A is illustrated, in accordance with various embodiments. For example, after a predetermined number of flight cycles, or due to an unscheduled maintenance, the process 200 may be performed for one or more of IBR 100 in the compressor section 24 of the gas turbine engine 20. In various embodiments, process 200 accumulates data over time, creating greater fidelity and improving future IBR repair determinations, in accordance with various embodiments.

Figure 7:
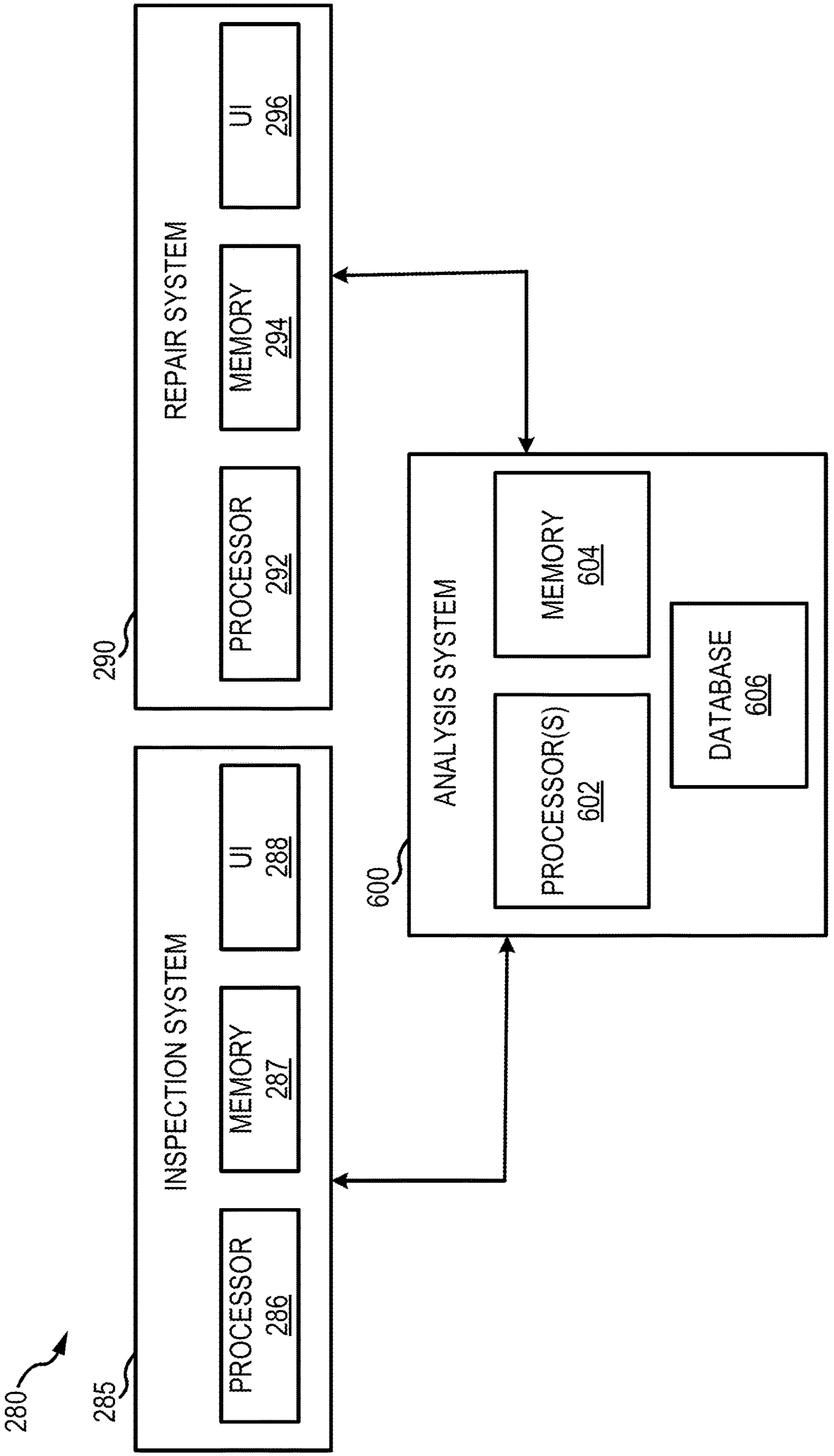
FIG. 7, illustrates a system to perform the inspection, analysis, and repair process of FIGS. 6A and 6B, in accordance with various embodiments.
Figure 8:
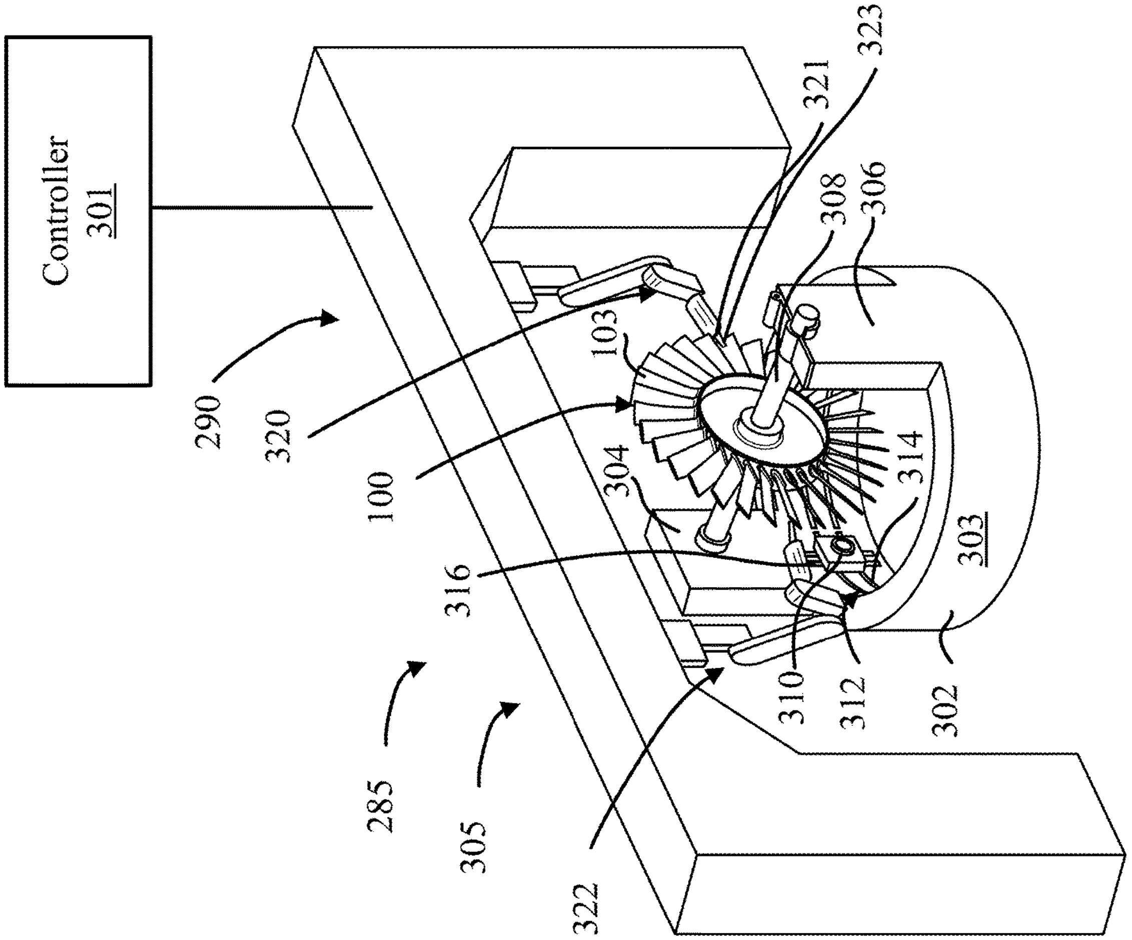
FIG. 8 illustrates an inspection and/or repair system, in accordance with various embodiments.

The process 200 comprises inspection of a bladed rotor (e.g., an IBR 100 from FIG. 1B) (step 202). In various embodiments, the dimensional inspection can be performed by an inspection system (e.g., inspection system 285 shown in FIGS. 7 and 8 further herein). In various embodiments, the dimensional inspection can be facilitated by use of an optical scanner (e.g., structured light scanners, such as white light scanners, structured blue light scanners, or the like) and/or a coordinate-measuring machine. The present disclosure is not limited in this regard. Thus, step 202 can further comprise scanning the IBR 100 with a scanner (e.g., structured light scanners, such as white light scanners, structured blue light scanners, and/or, a coordinate-measuring machine). In response to scanning the IBR 100, a digital representation of the IBR 100 (e.g., a point cloud, a surface model, or the like) from FIGS. 2-3 can be generated (e.g., via the inspection system 285 from FIGS. 7 and 8). In this regard, the defects 140 of the IBR 100 can be graphically depicted in a three-dimensional model (e.g., a Computer Aided Design (CAD) model or Finite Element Model (FEM), an aerodynamic model, or the like. However, an FEM model (or aerodynamic model) that includes the defects 140 (i.e., with rough surfaces or the like), can cause issues with running structural and/or aerodynamic simulations. In this regard, the inspection system 285 (as shown in FIGS. 7 and 8) can be configured to generate or determine an initial (or baseline) blend shape (e.g., blend profile 162 from FIG. 5B, blend profile 166 from FIG. 5A, etc.) based on data from inspection step 202 (i.e., scanner data), as described further herein.

In various embodiments, the three-dimensional model generated from step 202 includes a digital representation each defect of the IBR 100 from FIGS. 2-3. In this regard, the process 200 further comprises determining whether the IBR 100 meets serviceable limits (step 204). In various embodiments, "serviceable limits" as described herein refers to objective parameter limits of defects (e.g., wear, damage, etc.) for the IBR 100. For example, an objective parameter limit can be a threshold defect depth, a threshold defect length, a threshold defect aspect ratio, a threshold number of defects per blade, a threshold number of defects per IBR 100, any combination of the objective parameter limits disclosed herein, or the like. The present disclosure is not limited in this regard, and one skilled in the art may recognize various objective parameters for quantifying whether an IBR meets serviceable limits and be within the scope of this disclosure. In various embodiments, step 204 can be performed by an inspection system 285 or an analysis system 600 as described further herein. The present disclosure is not limited in this regard. If step 204 is performed by the inspection system 285, a determination on whether the IBR 100 is serviceable can be made rather quickly, on-site at an overhaul facility, in various embodiments. If step 204 is performed by the analysis system 600, a quick turnaround could still be achieved via cloud computing, or the like, as described further herein, in accordance with various embodiments. In this regard, step 204 can potentially be determined more quickly due to greater potential computing power in a cloud based environment.

In various embodiments, in response to the IBR 100 meeting serviceable limits in step 204, the process further comprises returning the IBR 100 to service (step 206). In this regard, the IBR 100 can be re-installed on a gas turbine engine 20 from FIG. 1A. In various embodiments, the IBR 100 is installed on the same gas turbine engine 20 from which it was removed from. However, the present disclosure is not limited in this regard, and the IBR 100 could be installed on a different gas turbine engine 20 from which it was removed and still be within the scope of this disclosure.

In various embodiments, in response to the IBR 100 not meeting serviceable limits in step 204, an initial blend profile (e.g., repair blend profile 162, repair blend profile 166, or repair blend profile 168 from FIGS. 5A-D) is determined and/or generated for each defect 140 of the IBR 100. In various embodiments, initial blend profiles can only be determined/generated for defects 140 that do not meet the objective defect parameter(s) from step 204. In various embodiments, digital representation of a blend profile 160 is generated for all defects 140 of the IBR 100. The present disclosure is not limited in this regard.

In various embodiments, the initial blend profile is based on consistent parameters and is generated automatically via the process 200. For example, each initial blend profile may be determined in step 208 to remove a predetermined amount of additional material and to generate a smooth blend across the entirety of the defect (e.g., transforming a digital representation of defects 140 to repair blend shapes 160). In various embodiments, a model is generated in step 208. The model generated in step 208 can be a three-dimensional model (e.g., a Computer Aided Design (CAD) model or Finite Element Model (FEM)), or a plurality of two-dimensional section models (e.g., defining various cross-sections of a blade 103).

In various embodiments, an initial model generated in step 208 is configured to greatly reduce a file size of inspection data from step 202 to transfer relevant inspection data to an external analysis system (e.g., analysis system 600 as described further herein. In this regard, instead of a three-dimensional model, the scanner data can be converted in section data for an airfoil at various span lengths from a root of the airfoil, as described further herein. Thus, by converting a point cloud generated from inspection data (e.g., from a structured scanner or CMM machine as described previously herein), excess data that may be irrelevant for analysis of the inspected IBR 100 can be removed, to facilitate a quick and/or easy transfer of the relevant data to the analysis system 600 as described further herein.

In various embodiments, the model generated in step 208 can be converted into a three-dimensional model for use in various third party software programs, such as ANSYS, ANSYS Workbench, ANSYS Computational Fluid Dynamics (CFD), or the like. In this regard, after transferring the model from step 208 from the inspection system to the analysis system, the model from step 208 can be converted to a finite element model (FEM) for a structural analysis, an aerodynamic model for aerodynamic analysis, or the like. In this regard, a file size of the model from step 208 can be relatively small compared to a model size used in the structural analysis and/or the aerodynamic analysis as described further herein.

In this regard, structural and aerodynamic simulations can be performed in step 210 for a digital representation of a repaired IBR 170 (a "repaired IBR digital model" as described further herein). The repaired IBR digital model can be a CAD model or an FEM model based on a specific analytical simulation being performed, in accordance with various embodiments. A repaired IBR as described herein refers to a repaired IBR 170 at least one repaired blade portion 172 having at least one repair blend profile 160 (e.g., repair blend profile 162, 166, or 168 from FIGS. 5A-D). The digital representation is based on the inspected IBR that was inspected in step 202 and modeled with initial blend profiles for a plurality of defects 140 in the IBR 100, in accordance with various embodiments.

In various embodiments, the process 200 further comprises analyzing the repaired IBR digital model (step 210). In various embodiments, the analysis in step 210 includes various simulations. For example, the various simulations can include simulations to evaluate a modal assurance criteria (MAC), a resonant frequency, an aerodynamic efficiency, a stall margin, damage tolerance, dynamic stress from vibration, or the like. In various embodiments, damage tolerance may be an optional criteria to analyze (e.g., if the bladed rotor is not an IBR but a bladed rotor having a distinct rotor disk and distinct blades). The simulations can be via various simulation software platforms described previously herein.

In various embodiments, analyzing the repaired IBR digital model can include optimizing the blend profile shape based on various parameters. For example, step 210 can include iterating the blend profile shape based on the various simulations and results of the various simulations. In various embodiments, the blend profile shape is only analyzed for the initial blend profile generated in step 208. However, the present disclosure is not limited in this regard.

In various embodiment, step 210 further comprises comparing the simulation results to experience based criteria.

For example, if an IBR 100 is known, based on prior test data during development, to have a resonant frequency that varies by a threshold percentage (e.g., 3%, 5%, 8%, etc.)

from a nominal frequency, and if a threshold number of the IBR 100 have been in service for a threshold number of cycles (e.g., 2,000 flight cycles, 10,000 flight cycles, or the like), then an experience based criteria for the resonant frequency can be created. For example, if a modal analysis determines a resonant frequency for the repaired IBR digital model is within the threshold percentage, the experience based criteria for resonant frequency would be considered met because the experimental data from development that indicates that the IBR 100 varies in resonant frequency by the threshold percentage without issue has been validated by experience by the threshold number of the IBR 100 having been in service for the threshold number of cycles. Stated another way, the resonant frequency being acceptable within a threshold range of frequencies has been validated by experience in service.

Similarly, if an IBR 100 is known, based on prior test data during development, to have a MAC that varies by a threshold percentage (e.g., 3%, 5%, 8%, etc.) from a nominal MAC, and if the threshold number of the IBR 100 have each been in service for the threshold number of cycles, then an experience based-criteria for the MAC can be created. For example, if the simulation to determine the MAC for the for repaired IBR digital model is less than the nominal MAC plus the threshold percentage, the MAC can be determined acceptable as being validated by experience in a similar manner as the resonant frequency example provided above.

If an IBR 100 is known, based on prior test data during development, to have an aerodynamic efficiency that varies by a threshold percentage (e.g., 3%, 5%, 8%, etc.) from a nominal aerodynamic efficiency, and if the threshold number of the IBR 100 have each been in service for the threshold number of cycles, then an experience based-criteria for the aerodynamic efficiency can be created. For example, if the simulation for the repaired IBR digital model has a greater aerodynamic efficiency than the nominal aerodynamic efficiency less the threshold percentage, than the aerodynamic efficiency being acceptable has been validated by experience in the field.

In various embodiments, the acceptable experience based criteria for aerodynamic efficiency can be based on being greater than the aerodynamic efficiency determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a stall margin that varies by a threshold percentage (e.g., 3%, 5%, 8%, etc.) from a nominal stall margin, and if the threshold number of the IBR 100 have each been in service for the threshold number of cycles, then an experience based-criteria for the stall margin can be created. For example, if the simulation to determine stall margin for the repaired IBR digital model has a greater stall margin than the nominal aerodynamic stall margin less the threshold percentage, than the stall margin being acceptable has been validated by experience in the field.

In various embodiments, the acceptable experience based criteria for stall margin can be based on being greater than the nominal stall margin determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a damage tolerance (e.g., a threshold crack size that results in growth during operation) that varies by a threshold percentage (e.g., 3%, 5%, 8%, etc.) from a nominal damage tolerance, and if the threshold number of the IBR 100 have each been in service for the threshold number of cycles, then an experience based-criteria for the damage tolerance can be created. For example, if the simulation to determine damage tolerance for the repaired IBR digital model has a lower threshold crack growth size than the nominal threshold crack growth size plus the threshold percentage, than the damage tolerance being acceptable has been validated by experience in the field.

In various embodiments, step 210 further comprises comparing the repair blend profile (e.g., repair blend profile 162, 166, or 168 from FIGS. 5A-D, or the like) to an experience-based repair blend profile. For example, a size of the repair blend profile generated from step 208 can be compared to known repair blend profiles that have been utilized successfully in the past. In various embodiment, a size (e.g., a depth D1, a length L1, and a width W1 as shown in FIGS. 5A-D) of the repair blend profile 162, 166, or 168 that was generated from step 208 exceeds a size of a known repair blend profile. In various embodiments, the known repair blend profiles can be limited by a location of the repair blend profile. For example, a location of the repair blend profile generated from step 208 may have to be a threshold distance from a location of the known repair blend profile, in addition to below a threshold size in order for the experience-based repair blend profile to meet the experience-based criteria. For example, in various embodiments, a threshold distance may be less than 0.5 inches, less than 0.25 inches, less than 0.1 inches, or the like. In various embodiments, a threshold distance can be measured from a center (e.g., center 161 from FIG. 5C) of a repair blend profile to a center of a known repair blend profile along an airfoil surface. In various embodiments, the center 161 from FIG. 5B is defined by a point along a line that is on a surface of the airfoil that defines a longitudinal distance of the repair blend profile (i.e., a longest distance from one side of the repair blend profile to another side of the repair blend profile), such as L1 from FIG. 5B.

In various embodiments, if the initial blend definition (e.g., from step 208) is below a threshold blend size (e.g., a threshold depth, a threshold aspect ratio, etc.), then an experience based criteria for the repair blend shape can be considered met in step 212. In various embodiments, if the initial blend definition from step 208 is above the threshold blend size, the repair blend profile would not meet the experience-based criteria for the repair blend shape, and the process 200 would proceed to step 222 as described further herein. In this regard, the systems and methods disclosed herein can facilitate further analysis and potential approval of much larger blend profiles, in accordance with various embodiments. "Large blend profiles," as referred to herein are blend profiles that exceed a threshold depth, a threshold aspect ratio, a threshold width, a threshold longitudinal length, or the like). In various embodiments, the threshold blend can be based on prior experience as described previously herein (i.e., a blend size known based on experience to meet the experience-based criteria in step 212 of process 200 from FIGS. 6A and 6B).

Thus, after analyzing the repaired IBR digital model in step 210, the process 200 further comprises determining whether the experienced based criteria is met for each experience-based criteria parameter (step 212). In various embodiments, the experience based criteria described herein is exemplary, and not all experience based parameters may be analyzed for a respective repaired IBR.

In various embodiments, in response to the simulation data from the various simulations showing that the experience based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5. In various embodiments, the repair process is performed by a repair system as described further herein. The present disclosure is not limited in this regard.

In various embodiments, in response to the simulation data from the various simulations showing that the experience-based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5. In various embodiments, the repair process is performed by a repair system as described further herein. The present disclosure is not limited in this regard.

Figure 6B:
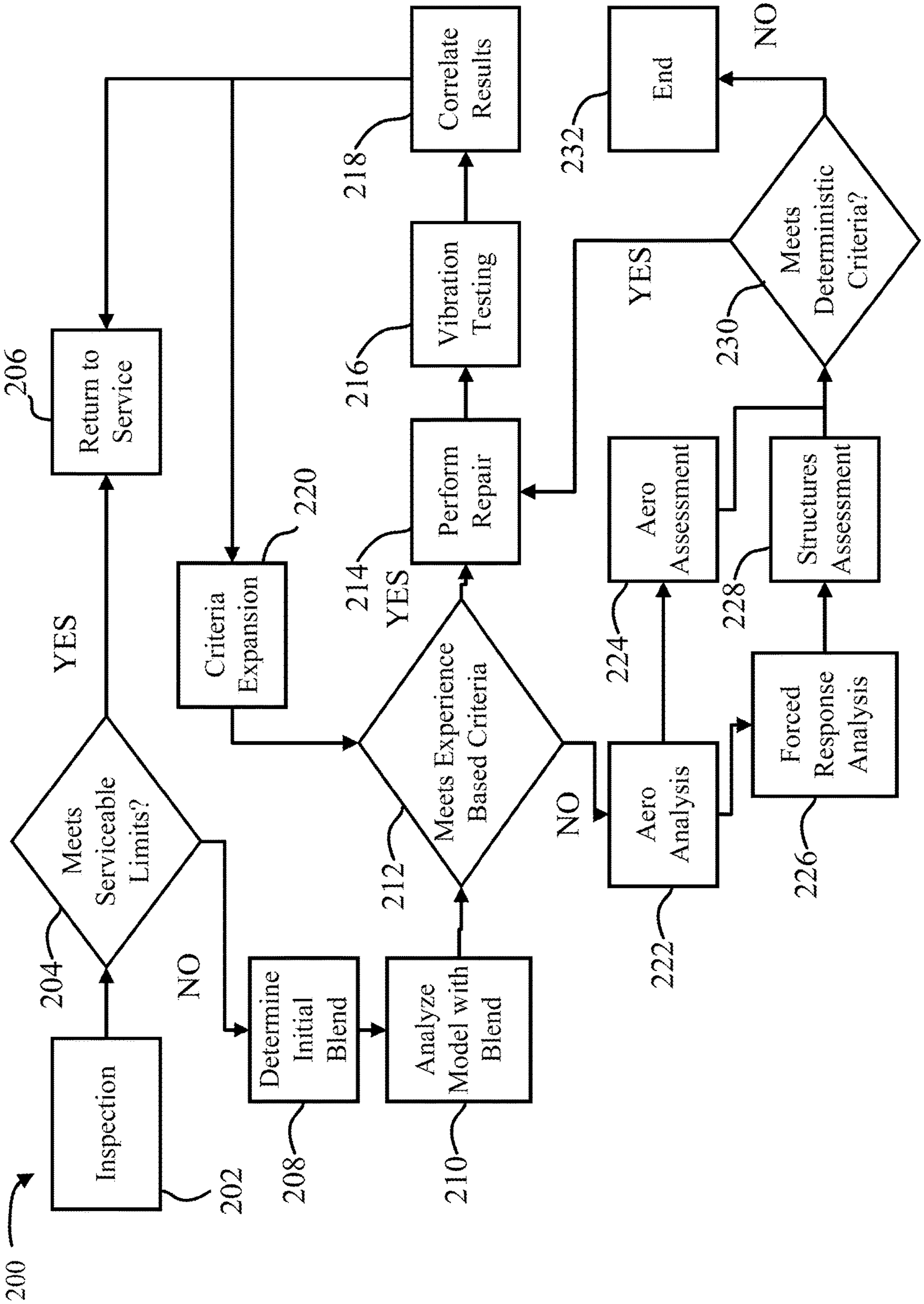
FIG. 6B illustrates an inspection, analysis, and repair process for a bladed rotor, in accordance with various embodiments.

In various embodiments, with brief reference to FIG. 6B, the process 200 can further comprises vibration testing (step 216) and correlating the results from the simulations in step 210 (step 218). Although illustrated as including vibration testing and correlation of results in steps 214, 216, the process 200 may disregard these steps and move directly to returning the repaired IBR to service in step 206, as shown in FIG. 6A. The present disclosure is not limited in this regard. In various embodiments, the vibration testing step 216 can be a bench test (i.e., on a machine configured to induce a response at a specific resonant frequency) or an on-engine test. The present disclosure is not limited in this regard. In various embodiments, results may be correlated based on an analysis of strain gauge data.

Referring back to FIG. 6A, the process 200 further comprises expansion of experience based criteria in step 220. In this regard, based on additional testing after performing the repair, threshold values can be updated for the experience based criteria to provide greater fidelity and generate faster dispositions for future repair processes, in accordance with various embodiments.

In various embodiments, in response to the experience based criteria not being met, additional analysis of the repaired IBR digital model can be performed in steps 222, 224, 226, and 228. In this regard, aerodynamic models with greater fidelity can be generated for the CFD analysis in step 222, and finite element models with greater fidelity (e.g., greater number of nodes or the like) can be generated for the forced response analysis and the structures assessment in step 228.

In various embodiments, the analysis performed in steps 222, 224, 226, and 228 are performed at a higher fidelity because they will be analyzed as if the repaired IBR is beyond the established experience based criteria. In this regard, the aerodynamic assessment in step 224 and the structures assessment in step 228 can be compared to deterministic criteria (i.e., design criteria or the like). For example, although a resonant frequency of the IBR may not be at a resonant frequency within the experience based range, the resonant frequency may result in a dynamic stress in stress limiting locations that is less than the dynamic stress induced by the IBR 100, which would result in an IBR 100 that is more robust with regards to dynamic stress relative to an ideal IBR (e.g., a nominally dimensioned IBR 100). In various embodiments, even if a resonant frequency that is not with the experience based range of resonant frequencies results in a greater dynamic stress in limiting locations, the dynamic stress can still be less than a threshold dynamic stress based on a Goodman diagram threshold. In various embodiments, the threshold dynamic stress can correspond to a maximum alternating stress for the material for a mean stress at the location of the dynamic stress. Thus, even if the resonant frequency is outside a range of resonant frequencies that are known to be acceptable based on experience, and the resonant frequency generates a greater dynamic stress relative to the ideal IBR 100, the repaired IBR 170 can still be acceptable based on the deterministic criteria, in accordance with various embodiments. In this regard, a greater number of acceptable repairs for IBRs can be generated and a greater fidelity can be created for the experience based criteria as the process 200 is repeated for numerous IBRs 100 over time.

In various embodiments, in response to the deterministic criteria being met in steps 230, subsequent steps 214, 216, 218, 220, and 206 mentioned previously herein can be repeated. In various embodiments, the criteria expansion of step 220 after going through steps 222, 224, 226, 228, 230 can greatly widen acceptable experience based criteria as more data of various repair shapes and sized can be gathered over time.

In various embodiments, in response to the deterministic criteria not being met, the process 200 ends at step 232. In various embodiments, in response to the process ending at step 232, the repaired IBR digital model can be stored in a database for later analysis, and the IBR 100 can be placed in storage. In this regard, the repaired IBR digital model could be utilized in later higher fidelity simulations analyzing the IBRs at a system level to determine if the IBR would be acceptable at a system level. Thus, the process 200 can further accommodate system level analysis of IBRs that don't meet the deterministic criteria in step 230, in accordance with various embodiments.

Figure 6C:
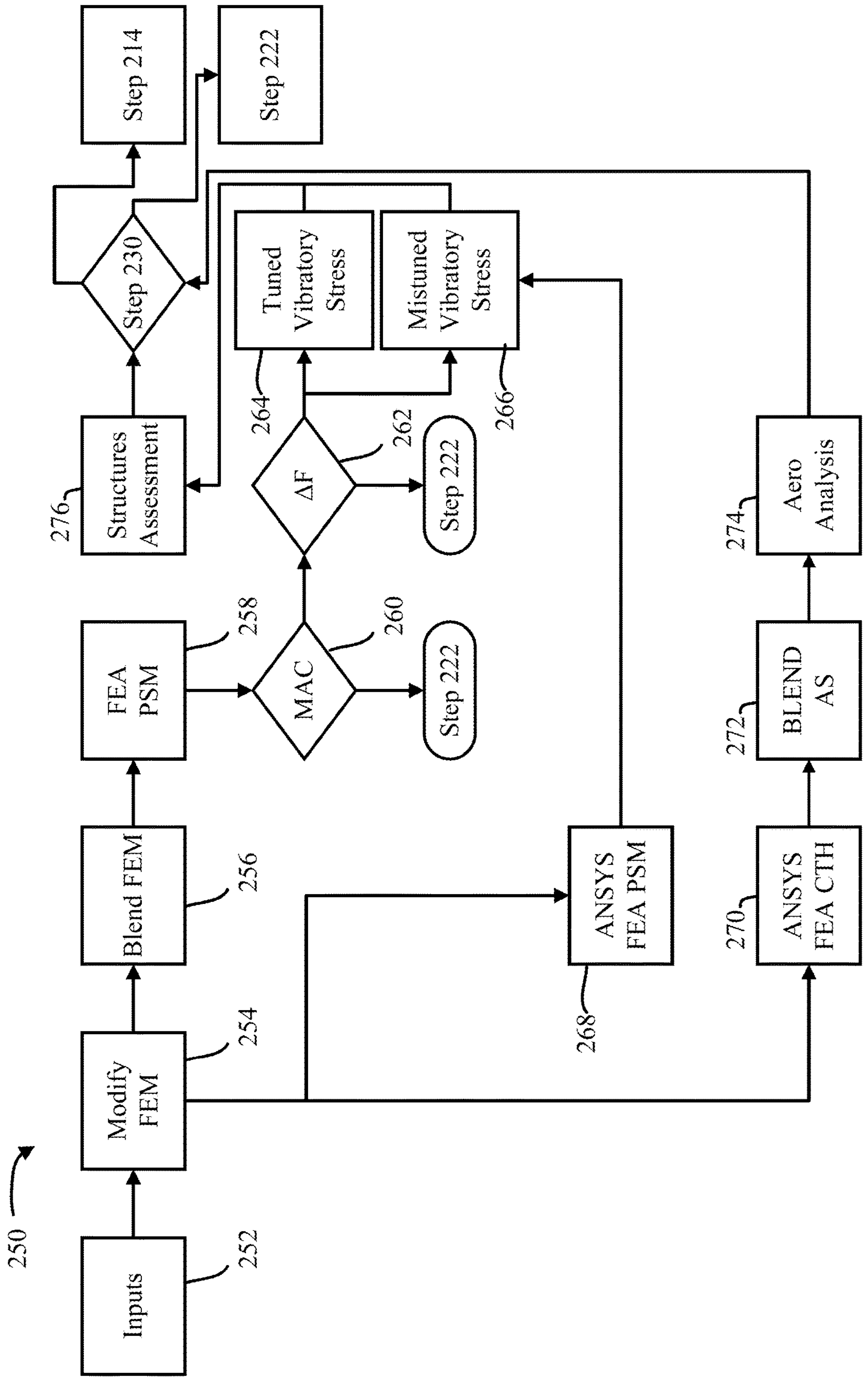
FIG. 6C illustrates an analysis during the inspection, analysis, and repair process for a bladed rotor from FIGS. 6A-B, in accordance with various embodiments.

Referring now to FIG. 6C, a detailed view of steps 210, 212 from process 200 are illustrated in accordance with various embodiments as a sub-process (e.g., process 200). Although illustrated and described herein as a subprocess of the process 200, present disclosure is not limited in this regard. For example, the process 250 can be utilized independently from the process 200 from FIG. 6A. Similarly, the process 250 is not meant to limit variations to the process 200 in steps 208, 210, 212 as described previously herein.

In various embodiments, the process 250 comprises receiving inputs for the various simulations described previously herein with respect to the analyzing step 210 from process 200 (step 252). For example, the inputs may include blade definition (e.g., determined from the inspection step 202 from process 200), blend definition (i.e., determined from step 208 from process 200), experience based criteria as described previously herein, high cycle fatigue conditions (i.e., boundary conditions for modal analysis), high cycle fatigue capability (e.g., material data described further herein), boundary conditions for fine particle modeling (FPM), a baseline FEM (e.g., a nominal finite element model of an ideal IBR 100), section files defining blade definition (i.e., two-dimensional cross-sectional contours of a blade determined from a digital point cloud received form the inspection step 202 from process 200), section files to FEM alignment parameters, aerodynamic analysis boundary conditions, structural analysis boundary conditions, etc. The present disclosure is not limited in this regard. In various embodiments, once the load inputs 252 are transferred to an analysis system, the process 250 can run upon receiving data from the inspection step 202 as described further herein.

The process 250 further comprises modifying an ideal finite element model (FEM) corresponding to an ideal IBR based on data received from the inspection step 202 (e.g., based on the digital point cloud and modified to reduce a data size to include mainly relevant data and limit irrelevant data for analysis) (step 254). In this regard, the ideal finite element model can be modified based on measured geometry of a respective blade 103 in step 202 of process 200 and an initial blend profile determined from step 208 of process 200, in accordance with various embodiments.

In various embodiments, step 254 further comprises comparing the relevant data received from the inspection system to the ideal digital representation of the model and modifying the digital representation of the ideal bladed rotor to a digital representation of the inspected bladed rotor with the initial blend profile determined from step 208 of process 200. In this regard, as described further herein, the digital representation of the ideal bladed rotor can be morphed to reflect the digital represent of the inspected bladed rotor with the initial blend profile for each respective defect based on a size of the defect 140 (e.g., a depth, a length, and a width of the defect 140 or the like) and a location of the defect 140 from FIG. 2. Thus, analysis performed further herein can more closely reflect the bladed rotor that was inspected in step 202, in accordance with various embodiments In various embodiments, the process 250 further comprises performing pre-stressed modal analysis with pre and post processing operations of the blended finite element model from step 256 (step 258). In this regard, steady state analysis, modal analysis, and/or any additional post-processing for the finite element analysis (FEA) and/or pre-stressed modal (PSM) can be performed prior to mode shape analysis and resonant frequency comparisons.

In various embodiments, the process 250 further comprises assessing mode shape shift relative to the ideal IBR (step 260). The mode shift can be assessed using mode match results. Magnitude of a respective mode shape can be compared to experience based criteria for MAC as described previously herein. In various embodiments, if the MAC does not meet the experience based criteria in step 260, the process 250 reverts to step 222 of process 200. In response to the experience criteria for MAC being met, the process 250 assesses frequency shift relative to experience based data as described previously herein (i.e., as described with respect to step 208 of process 200 above) (step 262). In response to the experience based criteria for frequency shift not being met, the process 250 reverts to step 222 of process 200 as described previously herein. In response to the experience based criteria for frequency shift being met, the process 250 proceeds to a tuned vibratory stress analysis in step 264 and a mistuned vibratory stress analysis in step 266.

In various embodiments, the tuned vibratory stress analysis is configured to account for any change in mode shape caused by geometric changes from the blend and specific geometry of adjacent blades to a blade being blended as described previously herein. In various embodiments, a tuned stress factor is calculated and applied to the vibratory stress prior to high cycle fatigue analysis. In various embodiments, the tuned vibratory stress analysis performs the comparison by pulling in the FEA and PSM analysis of the baseline from step 268 (i.e., an ideal IBR), in accordance with various embodiments.

In various embodiments, the mistuned vibratory stress analysis in step 266 is configured to account for frequency distribution for all the blades of the inspected IBR 100 from step 202 of process 200. In this regard, a mistuned stress correction factor can be calculated to adjust for mistuning effects prior to performing a high cycle fatigue assessment in step 276 as described further herein.

After the tuned vibratory stress analysis (step 264) and the mistuned vibratory stress analysis (step 266) are performed, a structures assessment, including the high cycle fatigue (HCF) assessment of the IBR 100 with potential repair blend profiles 160, can be analyzed (step 276). In various embodiments, the structures assessment performed in step 276 can also include a crack growth assessment (i.e., damage tolerance assessment) to determine a maximum flaw size that the IBR 100 with the potential repair blend profiles 160 can tolerate without growth.

In various embodiments, steps 264, 266, 276 are not limited to vibratory stress analysis, mistuning stress analysis, HCF assessment, or crack growth assessment as described previously herein. For example, flutter can also be analyzed by various simulations and be within the scope of this disclosure. Similarly, the analysis can be strictly physics based and/or scaled based on test data, in accordance with various embodiments. In various embodiments, structural simulations for unsteady CFD can also be performed an analyzed and be within the scope of this disclosure.

In various embodiments, the process 250 can extend directly from step 262 to step 212. For example, the structural simulations in steps 264, 266, and the structural assessment in step 276 can be optional, in accordance with various embodiments.

In various embodiments, while the structures analysis is being performed in steps 254, 256, 258, 260, 262, 264, 266, 268, an aerodynamic analysis can be performed simultaneously in steps 270, 272, 274. For example, in step 270 a cold to hot analysis of the IBR 100 can be performed prior to performing an aerodynamic analysis. A cold to hot analysis includes the change in the shape of IBR 100 from the conditions the airfoil was inspected at to the engine operating conditions of interest in the aerodynamic analysis based on structural boundary conditions.

In various embodiments, the aerodynamic model can be modified in step 272 to replicate the potential repair blend profile 160 and be as similar as possible to the potential repair blend profile model in step 256 (step 272). In various embodiments, the aerodynamic model with the potential repair blend profile modeled and the cold to hot analysis serving as inputs can be analyzed via computational fluid dynamics (e.g., via a fine particle model (FPM)) using aerodynamic boundary conditions as described previously herein.

In various embodiments, results from the HCF assessment and the crack growth assessment in step 276, and results from the CFD analysis from step 274 can be compared to experience-based criteria in step 212 of process 200 as described previously herein.

Thus, if the HCF assessment and the crack growth assessment meet the experience-based criteria in step 212, the process proceeds to step 214 of process 200. If the results from the HCF assessment and the crack growth assessment do not meet the experience-based criteria in step 212, then the process proceeds to step 222 in process 200 as described previously herein.

Referring now to FIG. 7, a system 280 for inspecting, analyzing, and repairing an IBR 100 is illustrated, in accordance with various embodiments. In various embodiments, the system 280 includes an inspection system 285, an analysis system 600, and a repair system 290. Although illustrated as separate systems with separate processors (e.g., processors 286, 602, 292), the present disclosure is not limited in this regard. For example, the system 280 may include a single processor, a single memory, and a single user interface and still remain within the scope of this disclosure.

Similarly, although inspection system 285 and repair system 290 are illustrated as separate systems with separate processors, memories and user interfaces, the present disclosure is not limited in this regard. For example, the inspection system 285 and the repair system 290 may be combined into a single system that communicates with the analysis system 600, in accordance with various embodiments.

In various embodiments, the analysis system 600 may include one or more processors 602. The analysis system 600 may be configured to process a significant amount of data during an analysis step as described further herein. In this regard, the analysis system 600 may be configured for remote computing (e.g., cloud-based computing), or the like. Thus, a processing time and a volume of data analyzed may be greatly increased relative to typical repair systems, in accordance with various embodiments.

In various embodiments, the inspection system 285, the analysis system 600, and the repair system 290 each include a computer system comprising a processor (e.g., processor 286, processor(s) 602, and/or processor 292) and a memory (e.g., memory 287, memory 604, memory 294). The inspection system 285 and the repair system 290 may each comprise a user interface (UI) (e.g., UI 288, UI 296). In various embodiments, the inspection system 285 and the repair system 290 may utilize a single user interface to control both systems. The present disclosure is not limited in this regard.

The analysis system 600 may further comprise a database 606. In various embodiments, the database 606 comprises various stored data for use in the analysis system 600. The database 606 may include an inspected IBR database (e.g., with data from various prior inspected IBRs), a repair data database (e.g., with data from various prior repairs performed/approved), a load data database (e.g., with engine load data from structural and/or aerodynamic analysis), a test data database (e.g., with engine specific test data used for validation of structural and/or aerodynamic analysis), a design data database (e.g., with design models having nominal dimensions according to a product definition of the IBR 100), and/or a material data database (e.g., with material for each component utilized in an analysis step), in accordance with various embodiments.

System 280 may be configured for inspecting, analyzing, and repairing an IBR 100, in accordance with various embodiments. In this regard, a repair process for an IBR 100 may be fully automated, or nearly fully automated, in accordance with various embodiments, as described further herein.

In various embodiments, systems 285, 600, 290 may each store a software program configured to perform the methods described herein in a respective memory 287, 604, 294 and run the software program using the respective processor 286, 602, 292. The systems 285, 600, 290 may include any number of individual processors 286, 602, 292 and memories 287, 604, 294. Various data may be communicated between the systems 285, 600, 290 and a user via the user interfaces (e.g., UI 288, UI 296). Such information may also be communicated between the systems 285, 600, 290 and external devices, database 606, and/or any other computing device connected to the systems 285, 600, 290 (e.g., through any network such as a local area network (LAN), or wide area network (WAN) such as the Internet).

In various embodiments, for systems 285, 600, 290, each processor 286, 602, 292 may retrieve and executes instructions stored in the respective memory 287, 604, 294 to control the operation of the respective system 285, 600, 290. Any number and type of processor(s) (e.g., an integrated circuit microprocessor, microcontroller, and/or digital signal processor (DSP)), can be used in conjunction with the various embodiments. The processor 286, 602, 292 may include, and/or operate in conjunction with, any other suitable components and features, such as comparators, analog-to-digital converters (ADCs), and/or digital-to-analog converters (DACs). Functionality of various embodiments may also be implemented through various hardware components storing machine-readable instructions, such as application-specific integrated circuits (ASICs), field-programmable gate arrays (FPGAs) and/or complex programmable logic devices (CPLDs).

The memory 287, 604, 294 may include a non-transitory computer-readable medium (such as on a CD-ROM, DVD-ROM, hard drive or FLASH memory) storing computer-readable instructions stored thereon that can be executed by the processor 286, 602, 292 to perform the methods of the present disclosure. The memory 287, 604, 294 may include any combination of different memory storage devices, such as hard drives, random access memory (RAM), read only memory (ROM), FLASH memory, or any other type of volatile and/or nonvolatile memory.

The system 285, 290 may receive and display information via a respective user interface (e.g., UI 288 and/or UI 296). The user interfaces (e.g., UI 288 and/or UI 296) include various peripheral output devices (such as monitors and printers), as well as any suitable input or control devices (such as a mouse and keyboard) to allow users to control and interact with the software program. Although illustrated as not including a user interface, the analysis system 600 is not limited in this regard. For example, a user interface for the analysis system 600 can have a user interface to facilitate load inputs, retrieval of information from the inspection system 285, or the like.

In various embodiments, inspection system 285 and repair system 290 may each be in electronic communication with analysis system 600, directly or via a respective user interface (e.g., UI 288 and/or UI 296). inspection system 285 and repair system 290 may comprise any suitable hardware, software, and/or database components capable of sending, receiving, and storing data. For example, inspection system 285 and/or repair system 290 may comprise a personal computer, personal digital assistant, cellular phone, smartphone (e.g., those running UNIX-based and/or Linux-based operating systems such as IPHONE®, ANDROID®, and/or the like), IoT device, kiosk, and/or the like. Inspection system 285 and/or repair system 290 may comprise an operating system, such as, for example, a WINDOWS® mobile operating system, an ANDROID® operating system, APPLE® IOS®, a LINUX® operating system, and the like. Inspection system 285 and/or repair system 290 may also comprise software components installed on inspection system 285 and/or repair system 290 and configured to enable access to various system 280 components. For example, inspection system 285 and/or repair system 290 may comprise a web browser (e.g., MICROSOFT INTERNET EXPLORER®, GOOGLE CHROME®, APPLE SAFARI® etc.), an application, a micro-app or mobile application, or the like, configured to allow the inspection system 285 and/or repair system 290 to access and interact with analysis system 600 (e.g., directly or via a respective UI, as discussed further herein).

Figure 9:
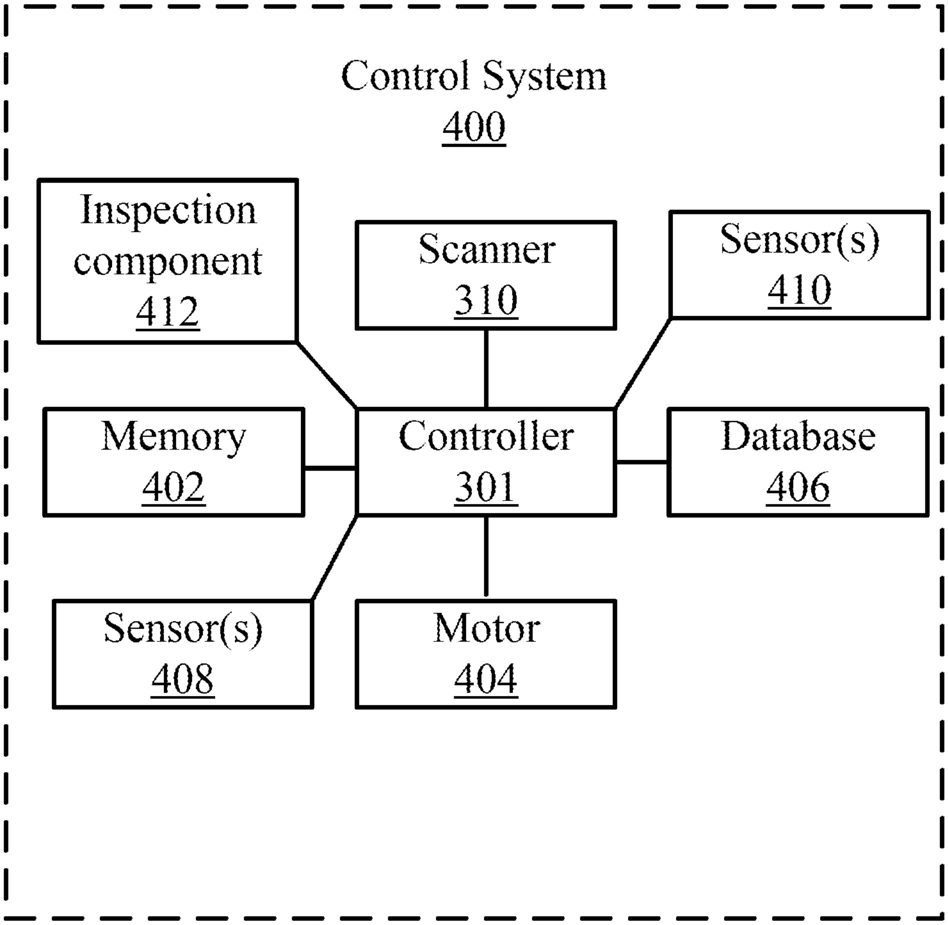
FIG. 9 illustrates a schematic view of a control system for an inspection system, in accordance with various embodiments.

Referring now to FIGS. 8 and 9, a perspective view of a system 285 for use in an inspection step 202 and/or a repair step 214 of process 200 (FIG. 8) and a control system 400 for the inspection system 285 (FIG. 9) are illustrated in accordance with various embodiments. In various embodiments, the system 285 comprises a repair system 290 and an inspection system 285. For example, various components of the system 285 may be configured to inspect the IBR 100 and generate a digital map of the IBR 100 (e.g., a point cloud), the inspection system 285 may be configured to transmit the digital map to an analysis system (e.g., analysis system 600), the inspection system 285 may then receive the results from the analysis system 600, and/or perform a repair based on a determination from the analysis system 600, in accordance with various embodiments.

The inspection system 285 comprises a controller 301, a support structure 302, a shaft 308, and a scanner 310. In various embodiments, the control system 400 comprises the controller 301, the scanner 310, a memory 402, a motor 404, a database 406, and sensor(s) 408, sensor(s) 410, and inspection component 412. In various embodiments, the inspection system 285 comprises a device 305 configured for bladed rotor repair and/or bladed rotor inspection.

In various embodiments, the support structure 302 comprises a base 303, a first vertical support 304, a second vertical support 306. In various embodiments, the base 303 may be annular in shape. Although illustrated as being annular, the present disclosure is not limited in this regard. For example, the base 303 may be semi-annular in shape, a flat plate, or the like. In various embodiments, the vertical supports 304, 306 extend vertically upward from the base 303 on opposite sides of the base (e.g., 180 degrees apart, or opposite sides if the base 303 where a square plate). The shaft 308 extends from the first vertical support 304 to the second vertical support 306. The shaft 308 may be rotatably coupled to the motor 404, which may be disposed within the first vertical support 304, in accordance with various embodiments. The shaft 308 may be restrained vertically and horizontally at the second vertical support 306 but free to rotate relative to the second vertical support about a central longitudinal axis of the shaft 308. In various embodiments, a bearing assembly may be coupled to the second vertical support 306 to facilitate rotation of the shaft, in accordance with various embodiments.

In various embodiments, the IBR 100 to be inspected in accordance with the inspection step 202 of the process 200 via the inspection system 285 may be coupled to the shaft 308 (e.g., via a rigid coupling, or the like). The present disclosure is not limited in this regard, and the shaft 308 may be coupled to the IBR 100 to be inspected by any method known in the art and be within the scope of this disclosure.

In various embodiments, the scanner 310 is operably coupled to a track system 312. In various embodiments, the track system 312 may comprise a curved track 314 and a vertical track 316. The vertical track 316 may slidingly couple to the vertical track 316 (e.g., via rollers or the like). The scanner 310 may be slidingly coupled to the vertical track 316 (e.g., via a conveyor belt, linkages, or the like). In various embodiments, the scanner 310 is configured to extend from the track system 312 towards the IBR 100 during inspection of the IBR 100 in accordance with step 202 of the process 200. In this regard, the inspection system 285 may further comprise a control arm 322 (e.g., a robot arm), an actuator (e.g., in combination with the track system 312) or the like. Although described herein with tracks 314, 316. a control arm 322, and/or an actuator of track system 312, the present disclosure is not limited in this regard. For example, any electronically controlled (e.g., wireless or wired) component configured to move the scanner 310, a machining tool (e.g., a mill, a cutter, a lathe, etc.), or the like in six degrees of freedom relative to the IBR 100 is within the scope of this disclosure.

In various embodiments, the inspection component 412 comprises rollers for the curved track, a conveyor belt for the vertical track, and/or a robotic arm coupled to the scanner 310. In various embodiments, the inspection component 412 comprises only a control arm 322 (e.g., a robot arm). In various embodiments, the inspection component 412 comprises only the rollers for the curved track 314 and the conveyor belt or linkages for the vertical track 316. The present disclosure is not limited in this regard. In various embodiments, the inspection component 412 is stationary and the IBR 100 being inspected is moveable along three-axis, five-axis, or the like. The present disclosure is not limited in this regard.

In various embodiments, the scanner 310 comprises a coordinate measuring machine (CMM), a mechanical scanner, a laser scanner, a structured scanner (e.g., a white light scanner, a blue light scanner, etc.), a non-structured optical scanner, a non-visual scanner (e.g., computed tomography), or the like. In various embodiments, the scanner 310 is a blue light scanner. In various embodiments, the scanner 310 may be swapped with another scanner at any point during an inspection step 202 as described further herein. In various embodiments, the inspection system 285 may be configured to swap the scanner 310 with a different scanner during the inspection step 202 of process 200 as described further herein.

A "blue light scanner" as disclosed herein refers to a non-contact structure light scanner. The blue light scanner may have a scan range of between 100×75 $mm^2$-400×300 $mm^2$, in accordance with various embodiments. In various embodiments, an accuracy of the blue light scanner may be between 0.005 and 0.015 mm. In various embodiments, the blue light scanner be able to determine distances between adjacent points in the point cloud of between 0.04 and 0.16 mm as measured across three axes. In various embodiments, a volume accuracy of the blue light scanner may be approximately 0.8 mm/m. In various embodiments, a scan depth may be between approximately 100 and 400 mm. In various embodiments, the blue light scanner may comprise a light source including a blue LED. In this regard, the blue light scanner may be configured to emit an average wavelength between 400 and 450 nm, in accordance with various embodiments. Although described with various specifications herein, the blue light scanner is not limited in this regard, and one skilled in the art may recognize the parameters of the blue light scanner may extend outside the exemplary ranges. Use of a blue light scanner provides a high resolution point cloud for a three dimensional object.

In various embodiments, the inspection system 285 further comprises a control arm 320 of the repair system 290. In various embodiments the control arm 320 comprises a tool holder 321. The tool holder 321 is configured to couple to a subtractive component 323 (e.g., a mill, a lathe, a cutter, etc.). In various embodiments, the control arm 322 of inspection system 285 may be a control arm for the repair system 290 as well. In various embodiments, the control arms 320, 322 may be used in both the repair system 290 and the inspection system 285. The present disclosure is not limited in this regard.

The controller 301 may be integrated into computer system of the inspection system 285 (e.g., in processor 286 and/or memory 287 from FIG. 2B). In various embodiments, the controller 301 may be configured as a central network element or hub to various systems and components of the control system 400. In various embodiments, controller 301 may comprise a processor (e.g., processor 286). In various embodiments, controller 301 may be implemented as a single controller (e.g., via a single processor 286 and associated memory 287). In various embodiments, controller 301 may be implemented as multiple processors (e.g., a main processor and local processors for various components). The controller 301 can be a general purpose processor, a digital signal processor (DSP), an application specific integrated circuit (ASIC), a field programmable gate array (FPGA) or other programmable logic device, discrete gate or transistor logic, discrete hardware components, or any combination thereof. The controller 301 may comprise a processor configured to implement various logical operations in response to execution of instructions, for example, instructions stored on a non-transitory, tangible, computer-readable medium configured to communicate with the controller 301.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

In various embodiments, the motor 404 of the control system 400 is operably coupled to the shaft 308 of the control system 400. In various embodiments, the motor 404 may comprise a direct current (DC) stepper, an alternating current (AC) motor or the like. The present disclosure is not limited in this regard. In various embodiments, the sensor(s) 408 include Hall effect sensor(s), optical sensor(s), resolver (s), or the like. In various embodiments, sensor(s) 408 may include sensor(s) configured to detect an angular position of the shaft 308 during an inspection step for an IBR 100 (e.g., step 202 from the process 200). In this regard, during inspection of the IBR 100, the controller 301 receives sensor data from the sensor(s) 408. The controller 301 can utilize the sensor data received from the sensor(s) 408 to correlate an angular position of the IBR 100 being inspected with a location of the scanner 310 as described further herein. In various embodiments, the IBR 100 may remain stationary throughout an inspection process (e.g., inspection step 202 of process 200) and only a control arm (e.g., control arm 320 and/or control arm 322) may move. Thus, coordinates of the control arm(s) may be determined via sensor(s) 408 in a similar manner to orient and construct the IBR 100 being inspected.

In various embodiments, the sensor(s) 410 are configured to detect a position of the scanner 310 during the inspection step 202 of process 200. In this regard, sensor(s) 410 may be position sensors (e.g., capacitive displacement sensors, eddy-current sensors, Hall effect sensors, inductive sensors, optical sensors, linear variable differential transformer (LVDT) sensors, photodiode array sensors, piezoelectric sensors, encoders, potentiometer sensors, ultrasonic sensors or the like). The present disclosure is not limited in this regard. Thus, during inspection of the IBR 100 in accordance with step 202 of process 200, controller 301 is able to determine a location of the scanner 310 and an angular position of the IBR 100 throughout the inspection. Thus, based on the location of the scanner 310, an angular location of the IBR 100 and scanning data received from the scanner 310, a digital map (e.g., a robust point cloud) can be generated during the inspection step 202 of process 200 for the IBR 100 being inspected. In various embodiments, the point cloud encompasses the entire IBR 100 (e.g., between 95% and 100% of a surface area of the IBR 100, or between 99% and 100% of the surface area of the IBR 100).

Figure 10:
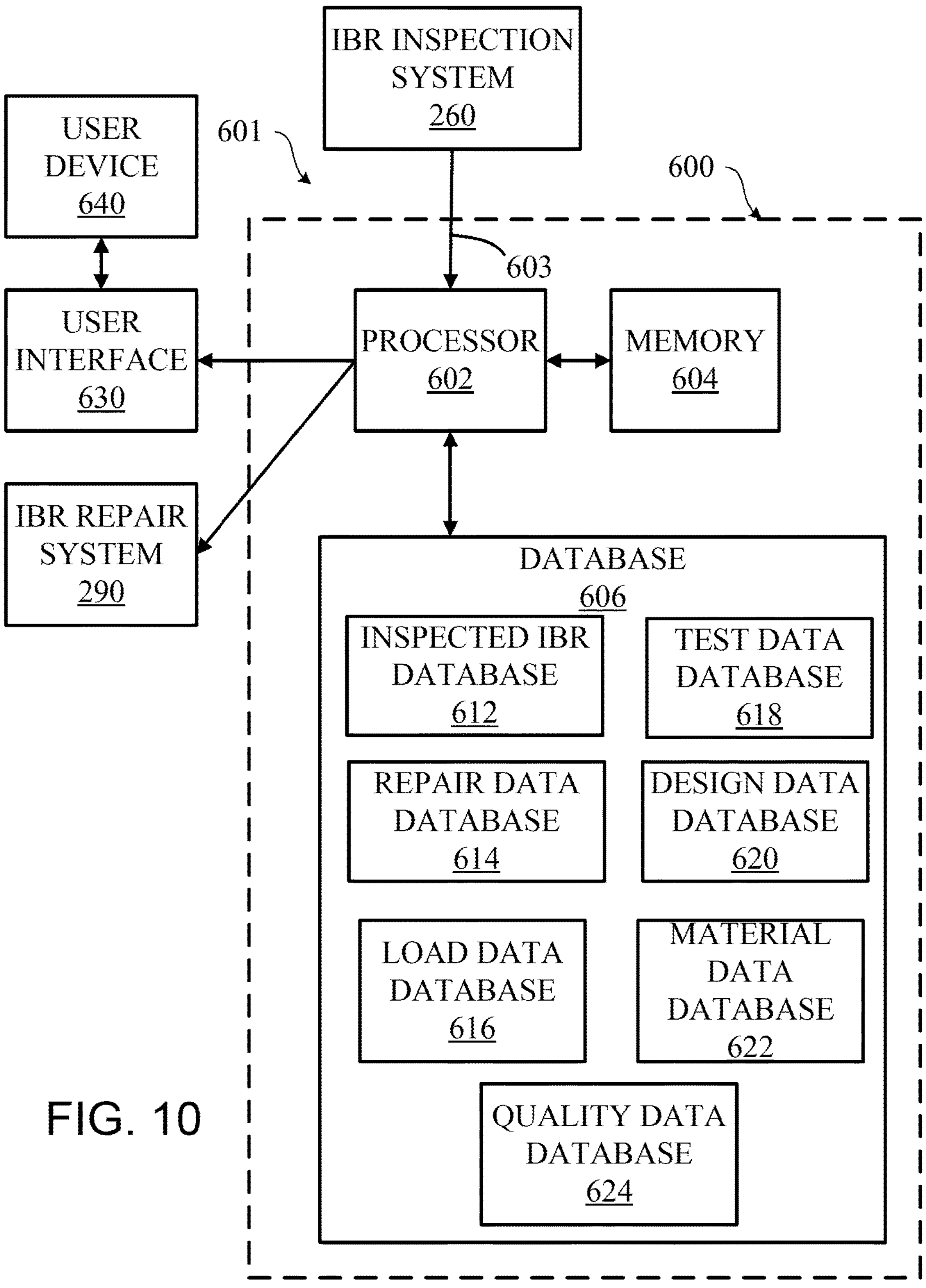
FIG. 10 illustrates a schematic view analysis system, in accordance with various embodiments.

Referring now to FIG. 10, an analysis system 600 for use in an inspection, analysis, and repair process (e.g., process 200 from FIG. 6A) as described previously herein is illustrated, in accordance with various embodiments. The analysis system 600 comprises the processor 602, the memory 604, and the database 606 from FIG. 7. In various embodiments, the analysis system 600 is a computer-based system. In various embodiments, the system 600 is a cloud-based computing system. The present disclosure is not limited in this regard. In various embodiments, the analysis system 600 comprises a machine learning system 601 (e.g., a deep neural network (DNN), an artificial neural network (ANN), or the like). In this regard, the analysis system 600 described herein can be configured for machine learning to constantly expand experience based criteria of step 212 in process 200 via step 220 as described previously herein.

The processor 602 is configured to receive an input 603 from the inspection system 285 (e.g., via the control system 400 from FIG. 7). The input 603 comprises a either a point cloud or a three-dimensional model of an IBR 100 inspected in accordance with the process described further herein. In various embodiments, in response to receiving the point cloud, the processor 602 is configured to convert the point cloud to a three-dimensional model (e.g., a finite element model (FEM) for structural analysis, a computation fluid dynamic (CFD) model for aerodynamic analysis, or any other model utilized for analysis).

In various embodiments, the analysis system 600 may include a port configured to couple to a hard drive, or any other device configured to transfer data obtained from inspecting the IBR 100 in step 202 of process 200. In various embodiments, the processor 602 may be in direct electronic (e.g., wireless or wired) communication with the inspection system 285 from step 202 of process 200. In various embodiments, the processor 602 is configured to communicate with the IBR inspection system over a network, or the like. The present disclosure is not limited in this regard.

In various embodiments, the processor 602 is in communication with a user interface ("UI") 630, which includes a user device 640. The analysis system 600 can be configured for determining a repaired IBR 170 having repair blend profiles 160 as shown in FIGS. 5A-D, in accordance with various embodiments. In this regard, the processor 602 of the analysis system 600 is configured to receive an input 603 (e.g., from the inspection system 285 of step 202 in process), perform various simulations and analyze the various simulations (e.g., in steps 210, 222, 224, 226, and/or 228), and output at the repair blend profiles 160 for respective defects 140 of the IBR 100. In various embodiments, the analysis system 600 may be configured to perform simulations based on the stack of IBRs 110 from FIG. 1B. Each IBR in the stack of IBRs 110 can be an IBR 100 that was inspected in step 202 of process 200. In this regard, a higher fidelity analysis can be performed in steps 222, 224, 226, 228 at a system level for IBR that don't meet the deterministic criteria in step 230 but could meet the deterministic criteria in step 230 based on a modification of an IBR 100 in the stack of IBRs 100. In this regard, the input 603 may comprise a point cloud or a three-dimensional model for each IBR 100 in a stack of IBRs 110 from FIG. 1B that have been inspected in accordance with process 500, in accordance with various embodiments.

In various embodiments, the database 606 includes an inspected IBR database 612 including available IBRs 100 for use in a stack of IBRs 110. In this regard, the analysis system 600 may be configured to mix and match IBRs 100, which were on different gas turbine engines 20 from FIG. 1A previously, based on an optimal repair process, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control (CNC) machine, an additive manufacturing machine, such as a directed energy deposition (DED) machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, and/or a material data database 622, in accordance with various embodiments.

In various embodiments, the inspected IBR database 612 comprises one of a point cloud or a three-dimensional model of inspected IBRs 100 received from the inspection system 285 that are awaiting repair in step 214 of the process 200. In this regard, the inspected IBR database 612 may include unrepaired IBRs 100 for use in the simulation and analysis steps of process 200 (e.g., steps 210, 222, 224, 226, and/or 228). Although described herein as including the inspected IBR database 612, the present disclosure is not limited in this regard. For example, repair options may be determined for an IBR 100 individually without analysis related to other IBRs 100 in the stack of IBRs 110 from FIG. 1B, in accordance with various embodiments. Similarly, repair options may be determined for one or more blades 103 of an IBR 100 individually without analysis related to other blades 103 for the IBR 100, in accordance with various embodiments. However, by increasing the scope to the IBR 100 component level and/or to the rotor module 111 level as described further herein, more optimal repair options may be determined (e.g., based on cost, time, amount of material removed, etc.), an IBR 100 which may have had a previously unrepairable airfoil determined at a blade level may be repairable based on a component level or module level analysis, and/or blending an airfoil without a defect to offset module or component level effects (e.g., mistuning, aerodynamic capability, etc.), in accordance with various embodiments.

In various embodiments, the repair data database 614 includes previously performed repairs (e.g., blend shapes, additive repair shapes, etc.). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the IBR analysis system, the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, after the processor 602 performs the various processes disclosed further herein, the processor 602 may output at least one repair process for a respective IBR 100 to the user device (e.g., through the UI 630, directly to the user device 640, or the like). In various embodiments, the output may comprise manual instructions for a blend repair process, a computer numerical control ("CNC") machining process (e.g., blending or the like). In various embodiments, the processor 602 sends CNC machining instructions to the repair system 290 directly, and the repair system 290 repairs the IBR 100 to generate a repaired IBR 170 from FIG. 5A, in accordance with various embodiments.

In various embodiments, the database 606 includes an inspected IBR database 612 including available IBRs 100 for use in a stack of IBRs 110 (i.e., as determined in step 232 of process 200). In this regard, the analysis system 600 may be configured to mix and match IBRs 100, which were on different gas turbine engines 20 from FIG. 1A previously, based on IBRs 100 not meeting deterministic criteria at a component level, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control ("CNC") machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, a material data database 622, and/or a quality data database 624 in accordance with various embodiments.

In various embodiments, the inspected IBR database 612 comprises one of a point cloud or a three-dimensional model of inspected IBRs 100 received from the inspection system 285 that are awaiting repair in step 214 of process 200 or did not meet deterministic criteria in step 230 of process 200. In this regard, the inspected IBR database 612 may include unrepaired IBRs 100 for use in system level analysis of a stack of IBRs 110, in accordance with various embodiments. In various embodiments by increasing the scope to the IBR 100 component level and/or to the rotor module 111 level, inspected IBRs that would otherwise be scrapped could potentially be combined in a stack of IBRs to meet satisfy structural criteria and system level aerodynamic criteria, in accordance with various embodiments.

In various embodiments, the repair data database 614 includes previously performed repairs (e.g., blend shapes). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.) (i.e., for component level analysis in steps 222, 224, 226 228, and/or for system level analysis performed after step 232 in process 200). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the analysis system 600 (e.g., steps 210, 222, 224), the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, the quality data database 624 comprises quality data associated with various quality information/dispositions for a known defect shapes, sizes, etc. For example, quality data (e.g., an estimated remaining life, or the like), associated with a known defect can be used for a defect having a size and shape corresponding to a known defect associated with a prior quality determination. In this regard, historical quality data can be utilized by the analysis system 600 for making dispositions and determinations for an inspected IBR as described further herein, in accordance with various embodiments.

Figure 11:
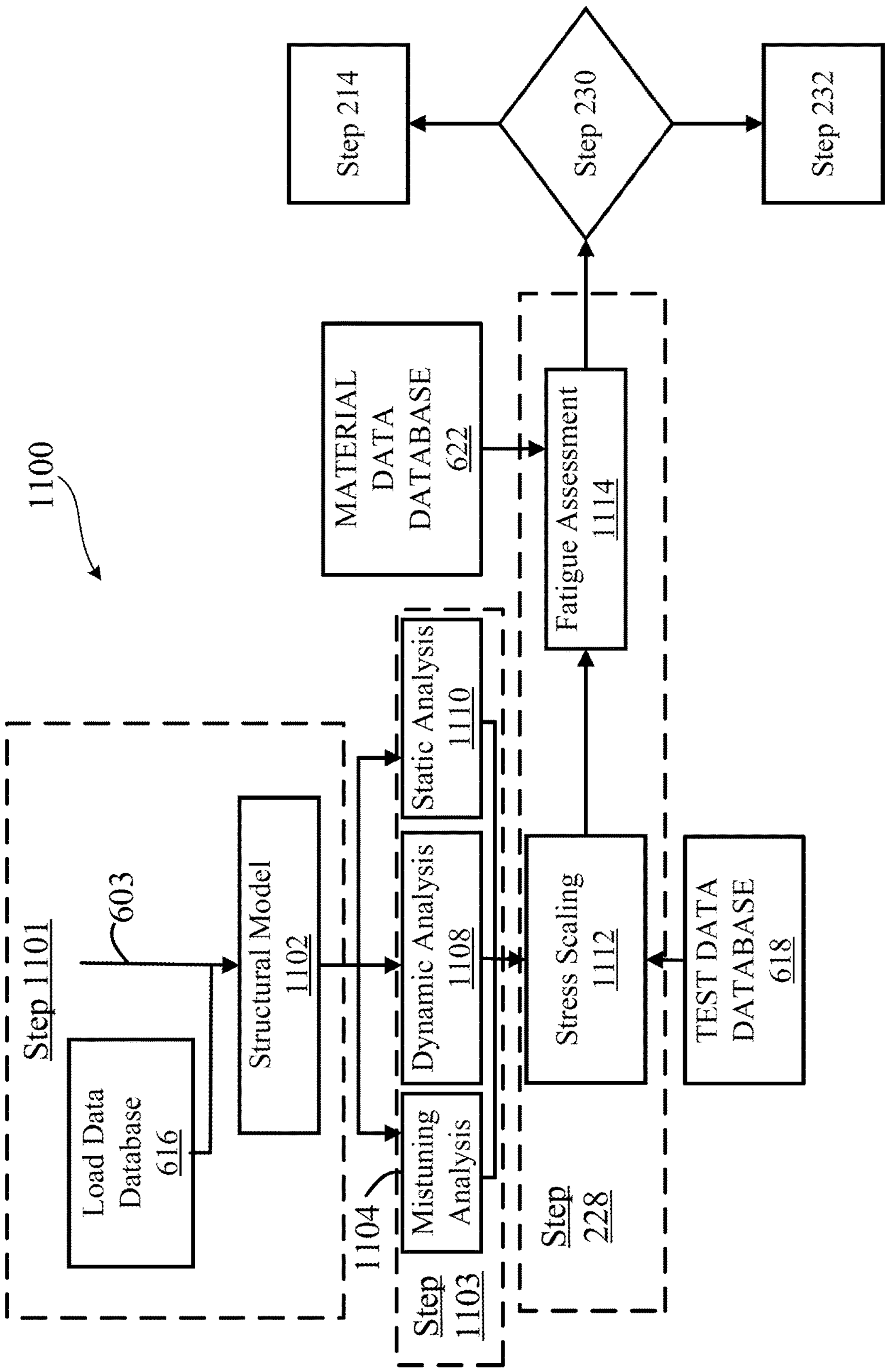
FIG. 11 illustrates a process for determining whether a large blend profile is an acceptable repair, in accordance with various embodiments.

Referring now to FIG. 11, a structural analysis and assessment process (e.g., steps 226, 228, 230 from process 200 in FIGS. 6A and 6B) with reference to analysis system 600 are illustrated, in accordance with various embodiments. Although the database 606 is illustrated as being a database of analysis system 600 in FIG. 10, the present disclosure is not limited in this regard. For example, some of the databases in analysis system 600 could be a part of IBR inspection system, or a local analysis system proximal the inspected IBR and still be within the scope of this disclosure. In this regard, dimensions for a potentially repaired IBR can be generated prior to data being transmitted to the analysis system 600 and still remain within the scope of this disclosure, in accordance with various embodiments.

In various embodiments, in response to an experience based criteria not being met (e.g., an initial repair blend profile exceeding a size of an experience based repair blend profile as described previously herein) in step 212 from process 200, the process 1100 can be initiated. Although process 1100 is shown having various steps, some of these steps could have been performed prior to process 1100 and still be within the scope of this disclosure.

In various embodiments, the process 1100 comprises generating a structural model 1102 (step 1101). In various embodiments, the structural model 1102 that is generated in step 1101 can be generated from various inputs (e.g., a flight envelope and/or loading from the load data database 616, a measured geometry from an inspected IBR provided by input 603, and/or a repair blend profile generated from input 603 in step 208 of process 200). In various embodiments, the repair blend profile can be generated based on specific defect parameters from the measured defect of the IBR provided by input 603.

In various embodiments, the process 1100 further comprises performing structural simulations on the structural model 1102 (step 1103). In various embodiments, the structural simulations can include a mistuning analysis 1104 (e.g., in accordance with step 266 from process 250), a dynamic analysis 1108 (e.g., a modal analysis), and a static analysis 1110. In various embodiments, the mistuning analysis 1104, the dynamic analysis 1108, and the static analysis 1110 can be performed via any structural simulation software, such as ANSYS, ANSYS Workbench, or the like. The present disclosure is not limited in this regard.

In various embodiments, boundary conditions of the static analysis includes inputs from the load data database 616. In this regard, worst case flight conditions (i.e., flight conditions that generate the greatest loads and/or induce the greatest amount of stress in an IBR) can be input into the static analysis 1110 as boundary conditions. In various embodiments, the dynamic analysis 1108 includes the forced response analysis 226 described previously herein.

In various embodiments, the process 1100 further comprises analyzing results generated from the structural simulations in step 1103 (step 228). In various embodiments, step 228 comprises stress scaling 1112 for the dynamic analysis 1108. In various embodiments, stress scaling 1112 is based on data from test data database 618. For example, test data database 618 can include engine test data for the IBR being repaired. In this regard, the engine test data can be actual dynamic loads measured on a test engine or rig, in accordance with various embodiments. During certification of an aircraft, various tests are performed to correlate simulated dynamic stress to actual dynamic stress. In this regard, the test data database 618 can include scale factors used to correlate results from the dynamic analysis 1108 to an expected stress that the simulated IBR would see on an engine.

In various embodiments, step 228 further comprises a fatigue assessment 1114 based on these various simulations. The fatigue assessment 1114 is performed with various inputs. For example, results from the static analysis 1110 provide steady state stress that the repaired IBR with the large blend profile would be expected to experience during operation of a gas turbine engine. Similarly, results from the dynamic analysis and the mistuning analysis (after stress scaling 1112), can be expected to be experienced by the repaired IBR with the large blend profile during operation of the gas turbine engine in response to being excited at a respective frequency. In various embodiments, the dynamic analysis 1108 and mistuning analysis 1104 after stress scaling 1112 can provide an expected alternating stress for various locations along a surface of a repaired IBR (e.g., various nodes in an FEA simulation). Similarly, the static analysis 1110 can provide an expected mean stress for various locations along a surface of repaired IBR under worst case loading as described previously herein (e.g., thermal loading, structural loading, or the like).

Figure 12:
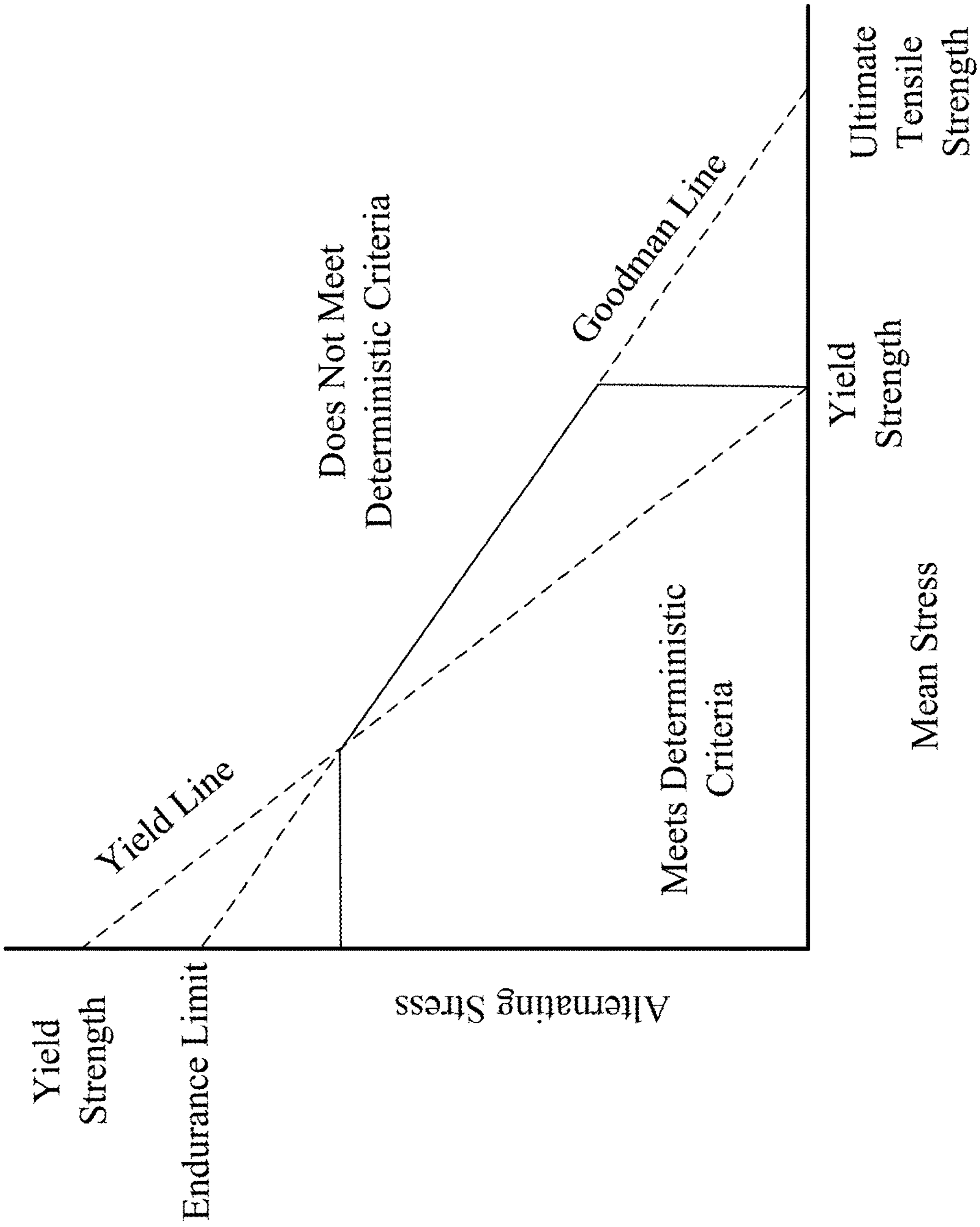
FIG. 12 illustrates a modified Goodman diagram for determining acceptability of a large blend profile.

In various embodiments, each node of a respective FEA model (e.g., from structural model 1102) can be analyzed with respect to modified Goodman diagram (as shown in FIG. 12 and described further herein). In this regard, for fatigue assessment 1114, the processor 602 of the analysis system 600 can pull material data from the material data database 622 to generate the modified goodman diagram 1114. In various embodiments, the material data database 622 includes various material properties of a material of the inspected IBR. For example, the material that the inspected IBR is made of can be a proprietary material that has been tested to determine material properties to a certain statistical level. In various embodiments, with reference now to FIG. 12, a yield strength, an endurance limit, and an ultimate tensile strength for the material can be determined from the statistical testing to a 0.001 significance (i.e., 1 in 1,000 of the material would have a yield stress that is less than the yield stress in the material data database). In various embodiments, a yield stress for the material can be determined from the statistical testing to a significance of 0.0001 (i.e., 1 in 10,000), or to a significance of 0.001 (i.e., 1 in 1,000). As there are other conservative estimates in the fatigue assessment, a lower statistical significance can still provide robust structural determinations and high safety factors.

In various embodiments, yield stress can be determined through experimentation of the material where an axial force is applied to a sample material and a resulting deformation is measured. In this regard, as described above, this testing can be performed on a statistically significant material samples and the respective data can be placed in the material data database 622 as described previously herein.

In various embodiments, an endurance limit can be determined via an axial testing machine, a bending fatigue machine, and/or a torsional fatigue machine. The present disclosure is not limited in this regard. This testing can be performed on a statistically significant material samples and the respective data can be placed in the material data database 622 as described previously herein.

In various embodiments, an ultimate tensile strength can be determined by pulling a material being tested in tension until fracture of the material occurs. An amount of force applied to the sample and an elongation of the sample can be measured to calculate the ultimate tensile stress of the material.

In various embodiments, the material can also be tested at various temperatures (i.e., expected operating temperatures, expected maximum operating temperatures, expected minimum operating temperatures, expected worst case operating temperatures of related components, or the like). The present disclosure is not limited in this regard. As a temperature of the IBR can effect the various material properties, expected temperature data can also be utilized for the fatigue assessment 1114 in step 228.

In various embodiments, based on results from the step 1103 and stress scaling 1112, the fatigue assessment 1114 can include plotting stresses from the mistuning analysis and/or the dynamic analysis (i.e., alternating stresses) with stress results from the static analysis 1110 (i.e., mean stresses) for the repaired IBR with the large repair blend profile under various loading conditions. For example, a worst case alternating stress for each node can be plotted with a mean stress for the same node under each loading condition on the modified goodman diagram shown in FIG. 12. As described previously herein, a higher mean stress may not be a worst case stress for a respective node due to a temperature providing a higher stress limit. For example, a mean stress at a first temperature could have a higher margin compared to a second mean stress that is lower than the first mean stress, but that is at a second temperature that greatly reduces a yield strength of the material. In this regard, the fatigue assessment can be based on worst case loading conditions, or each potential loading condition can be analyzed separately. The former may be more conservative, but may take a greater amount of time, whereas the latter can be more time consuming, but facilitate producing a greater number of repairs relative to typical systems and methods.

In various embodiments, the modified Goodman diagram as shown in FIG. 12 includes an alternating stress limit that extends from an intersection between a yield line (i.e., a line extending from a yield strength of a material on an alternating stress axis to a yield strength on a mean stress axis) and a Goodman line (i.e., an endurance limit of a material on the alternating stress axis to an ultimate tensile strength on the mean stress axis) at a constant alternating stress to a mean stress of 0. In various embodiments, the modified goodman can continue from the intersection along the goodman line (i.e., from the endurance limit on the alternating stress axis to an ultimate tensile strength on a mean stress axis) until the yield strength on the mean stress axis is reached. Once the yield stress is reached, the yield stress can remain constant from the alternating stress on the Goodman line to an alternating stress equal to zero. In various embodiments, the yield stress corresponds to a number of flight cycles until yield occurs. In various embodiments, the number of flight cycles can be based on an expected remaining service life for the IBR or based on a typical service life for a newly manufactured IBR. The present disclosure is not limited in this regard. In various embodiments, by utilizing an expected remaining service life, a greater number of repairs can be facilitated, in accordance with various embodiments.

Referring back to FIG. 11, after the fatigue assessment 1114, the process 1100 proceeds to step 230 to determine if the deterministic criteria for the repaired IBR is met. In this regard, as described above, alternating stress and mean stress are plotted on the modified Goodman diagram in any manner described above, and if all of the plot points are within the deterministic criteria envelope for each respective loading condition (i.e., expected temperature, worst case temperature, or the like), then the repaired IBR is considered to meet the deterministic criteria, and the large blend profile is performed on the prior inspected IBR in step 214 of process 200 from FIG. 6A or 6B, in accordance with various embodiments. In various embodiments, if the deterministic criteria is not met, the process 1100 proceeds to step 232 of process 200 from FIG. 6A or 6B.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A method, comprising:

performing a finite element static analysis of an inspected bladed rotor with an inspected blade, the inspected blade having a repair blend profile modeled thereon, the repair blend profile exceeding a threshold repair size;

performing a finite element modal analysis of the inspected bladed rotor with the inspected blade having the repair blend profile;

performing a fatigue assessment of the inspected bladed rotor based on results from the finite element static analysis and the finite element modal analysis, the fatigue assessment including limits based on material properties of the inspected blade, the material properties based on test results at a threshold significance level; and repairing the inspected bladed rotor with the repair blend profile in response to the fatigue assessment meeting a deterministic criteria.

2. The method of claim 1, wherein the finite element modal analysis includes at least one of a dynamic analysis and a mistuning analysis.

3. The method of claim 1, further comprising scaling stress results from the finite element modal analysis based on engine test data including actual dynamic loads corresponding to the inspected bladed rotor measured on a test engine.

4. The method of claim 1, wherein performing the fatigue assessment further comprises plotting an alternating stress as a function of a mean stress on a modified Goodman diagram, the alternating stress determined from the finite element modal analysis, the mean stress determined from the finite element static analysis.

5. The method of claim 1, further comprising:

initiating the repair blend profile prior to the performing the finite element static analysis and the performing the finite element modal analysis; and determining the repair blend profile exceeds the threshold repair size, the threshold repair size based on prior repair blend sizes.

6. The method of claim 1, wherein the threshold repair size is based on at least one of a longitudinal length, a width, and a depth of a maximum experience-based repair blend profile.

7. The method of claim 1, further comprising:

scanning the inspected bladed rotor; and determining the repair blend profile based on data from the scanning.

8. The method of claim 7, further comprising:

performing a simulation on a digital model prior to performing the finite element modal analysis and the finite element static analysis; and comparing a result from the simulation to an experience-based criteria.

9. The method of claim 8, further comprising determining the experience-based criteria is not met.

10. A method, comprising:

receiving, via a processor, a digital representation of an inspected blade from an inspection system and boundary conditions for a static analysis from a load data database, the digital representation including a repair blend profile;

generating, via the processor, a finite element structural model of an inspected bladed rotor including the inspected blade based on the digital representation of the inspected bladed rotor and the boundary conditions;

simulating, via the processor, a modal analysis of the finite element structural model;

simulating, via the processor, the static analysis of the finite element structural model; and conducting, via the processor, a fatigue assessment of the inspected bladed rotor with the repair blend profile based on a material data from a material data database and results from the modal analysis of the finite element structural model and the static analysis of the finite element structural model.

11. The method of claim 10, wherein the material data includes a yield stress, an endurance limit, and an ultimate tensile stress of a material, the inspected blade comprising the material.

12. The method of claim 11, wherein the yield stress, the endurance limit, and the ultimate tensile stress are a function of temperature.

13. The method of claim 11, wherein the yield stress is based on a number of flight cycles that remain for the inspected bladed rotor with the inspected blade after a repair.

14. The method of claim 10, further comprising determining, via the processor and prior to generating the finite element structural model, that the repair blend profile exceeds a threshold repair blend size, the threshold repair blend size based on an experience-based criteria.

15. A system, comprising:

an analysis system in electronic communication with an inspection system, the analysis system comprising a tangible, non-transitory computer-readable storage medium having instructions stored thereon that, in response to execution by a processor, cause the processor to perform operations comprising:

receive, via the processor, a data set based on a point cloud generated from the inspection system, the point cloud representative of an inspected bladed rotor;

generate, via the processor, a finite element structural model of the inspected bladed rotor including an inspected blade with a repair blend profile based on the data set;

determine, via the processor, the repair blend profile exceeds a size of a threshold repair blend profile;

simulate, via the processor, a modal analysis of the finite element structural model;

simulate, via the processor, a static analysis of the finite element structural model; and conduct, via the processor, a fatigue assessment of the inspected bladed rotor including the inspected blade with the repair blend profile.

16. The system of claim 15, wherein the operations further comprise determining whether results of the modal analysis and the static analysis meet a deterministic- criteria for the inspected bladed rotor based on the fatigue assessment.

17. The system of claim 15, further comprising the inspection system, wherein the inspection system comprises a structured scanner.

18. The system of claim 15, wherein the fatigue assessment is based on a material data from a material data database and results from the modal analysis of the finite element structural model and the static analysis of the finite element structural model.

19. The system of claim 18, wherein the material data includes a yield stress, an endurance limit, and an ultimate tensile stress of a material, the inspected blade comprising the material.

20. The system of claim 19, wherein the yield stress is based on a number of flight cycles that remain for the inspected bladed rotor with the inspected blade after a repair.

* * * * *